United States Patent
Yu et al.

(10) Patent No.: US 12,293,551 B2
(45) Date of Patent: May 6, 2025

(54) METHOD, DEVICE, AND STORAGE MEDIUM FOR DATA ENCODING/DECODING

(71) Applicants: SZ DJI TECHNOLOGY CO., LTD., Shenzhen (CN); ZHEJIANG UNIVERSITY, Hangzhou (CN)

(72) Inventors: Lu Yu, Hangzhou (CN); Jiafeng Chen, Hangzhou (CN); Wenyi Wang, Hangzhou (CN); Pu Li, Shenzhen (CN); Xiaozhen Zheng, Shenzhen (CN)

(73) Assignees: SZ DJI TECHNOLOGY CO., LTD., Shenzhen (CN); ZHEJIANG UNIVERSITY, Hangzhou (CN)

( * ) Notice: Subject to any disclaimer, the term of this patent is extended or adjusted under 35 U.S.C. 154(b) by 328 days.

(21) Appl. No.: 17/707,935

(22) Filed: Mar. 29, 2022

(65) Prior Publication Data

US 2022/0222861 A1 Jul. 14, 2022

Related U.S. Application Data

(63) Continuation of application No. PCT/CN2019/109691, filed on Sep. 30, 2019.

(51) Int. Cl.
*H04N 19/00* (2014.01)
*G06T 9/00* (2006.01)
*H03M 7/30* (2006.01)

(52) U.S. Cl.
CPC ............ *G06T 9/001* (2013.01); *H03M 7/3079* (2013.01); *H03M 7/6005* (2013.01); *H03M 7/6011* (2013.01)

(58) Field of Classification Search
CPC ...... H04N 19/61; H04N 19/186; H04N 19/13; H04N 19/91; H04N 19/18; H03M 7/3079; H03M 7/6011; H03M 7/6005
See application file for complete search history.

(56) References Cited

U.S. PATENT DOCUMENTS

2005/0196057 A1  9/2005  Suh
2010/0202540 A1  8/2010  Fang
(Continued)

FOREIGN PATENT DOCUMENTS

CN   102790878 A   11/2012
CN   104902271 A    9/2015
(Continued)

OTHER PUBLICATIONS

The World Intellectual Property Organization (WIPO) International Search Report for PCT/CN2019/109691 Jun. 29, 2020 4 Pages (including translation).

(Continued)

*Primary Examiner* — Li Liu
(74) *Attorney, Agent, or Firm* — ANOVA LAW GROUP, PLLC

(57) ABSTRACT

A data encoding method includes obtaining an attribute residual of a current point cloud point, binarizing the attribute residual to obtain a binary code of the current point cloud point that includes a first binary code indicating a first flag bit and a second binary code indicating a second flag bit, selecting a first context model from a context model list according to a first condition, selecting a second context model from the context model list according to a second condition, encoding the first binary code using the first context model, and encoding the second binary code using the second context model. The first condition and the second condition are different for the first context model and the second context model corresponding to a same index in the context model list.

20 Claims, 7 Drawing Sheets

(56) References Cited

U.S. PATENT DOCUMENTS

| | | |
|---|---|---|
| 2011/0090957 A1 | 4/2011 | Liao et al. |
| 2014/0092966 A1 | 4/2014 | Kazui et al. |
| 2019/0080483 A1 | 3/2019 | Mammou et al. |
| 2019/0081638 A1 | 3/2019 | Mammou et al. |
| 2019/0200046 A1 | 6/2019 | Lucas et al. |
| 2022/0038719 A1* | 2/2022 | Leleannec .............. H04N 19/91 |
| 2022/0078425 A1* | 3/2022 | Wang ..................... H04N 19/91 |
| 2024/0364883 A1* | 10/2024 | Cao ...................... H04N 19/176 |

FOREIGN PATENT DOCUMENTS

| | | |
|---|---|---|
| CN | 104935921 A | 9/2015 |
| CN | 108322742 A | 7/2018 |
| CN | 108632607 A | 10/2018 |
| CN | 110278443 A | 9/2019 |
| WO | 2013073154 A1 | 5/2013 |
| WO | 2019055772 A1 | 3/2019 |
| WO | 2019079397 A1 | 4/2019 |

OTHER PUBLICATIONS

Khaled Mammou et al. G-PCC codec description v2[C], MPEG Doc. ISO/IEC JTC1/SC29/WG11, N18189, Marrakech, MA, Jan. 2019.

Shuai Wan et al.. New Generation of High Efficiency Video Coding H. 265/HEVC: Principles, Standards and Implementation. Publishing House of Electronics Industry, 2014. 402 Pages in 4 parts (including translation of the Preface in lieu of concise explanation of relevance).

* cited by examiner

METHOD, DEVICE, AND STORAGE MEDIUM FOR DATA ENCODING/DECODING

CROSS-REFERENCE TO RELATED APPLICATION

This application is a continuation of International Application No. PCT/CN2019/109691, filed Sep. 30, 2019, the entire content of which is incorporated herein by reference.

TECHNICAL FIELD

The present disclosure relates to the field of point cloud encoding/decoding and, more particularly, to a method, a device, and a storage medium for data encoding/decoding.

BACKGROUND

In reference software of moving picture experts group (MPEG), point cloud data is divided into two parts, geometry and attributes, for encoding/decoding separately. When attributes are being encoded or decoded, attribute values undergo transformation/prediction, quantization, entropy encoding, and other processes.

In existing point cloud encoding/decoding schemes, attribute encoding/decoding adopts arithmetic encoding based on a context model. A method for attribute encoding/decoding based on the arithmetic encoding of the context model includes the context model for indicating attributes of two flag bits and selection conditions of the context model used to indicate the attributes of the two flag bits are the same. The context model selected in this way is not optimized, which may result in low attribute encoding/decoding efficiency. Therefore, how to better improve the efficiency of attribute encoding/decoding in point cloud data has become the focus of research.

SUMMARY

In accordance with the disclosure, there is provided a data encoding method including obtaining an attribute residual of a current point cloud point, binarizing the attribute residual to obtain a binary code of the current point cloud point that includes a first binary code indicating a first flag bit and a second binary code indicating a second flag bit, selecting a first context model from a context model list according to a first condition, selecting a second context model from the context model list according to a second condition, encoding the first binary code using the first context model, and encoding the second binary code using the second context model. The first condition and the second condition are different for the first context model and the second context model corresponding to a same index in the context model list.

In accordance with the disclosure, there is also provided a data decoding method including obtaining bitstream data of a current point cloud point that includes bitstream data of a first flag bit and bitstream data of a second flag bit, selecting a first context model from a context model list according to a first condition, decoding the bitstream data of the first flag bit using the first context model to obtain a first binary code indicating the first flag bit, selecting a second context model from the context model list according to a second condition, decoding the bitstream data of the second flag bit using the second context model to obtain a second binary code indicating the second flag bit, and performing inverse binarization on the first binary code and the second binary code to obtain an attribute residual of the current point cloud point.

In accordance with the disclosure, there is also provided a data encoding device including a memory storing a program and a processor configured to execute the program to obtain an attribute residual of a current point cloud point, binarize the attribute residual to obtain a binary code of the current point cloud point that includes a first binary code indicating a first flag bit and a second binary code indicating a second flag bit, select a first context model from a context model list according to a first condition, select a second context model from the context model list according to a second condition, encode the first binary code using the first context model, and encode the second binary code using the second context model. The first condition and the second condition are different for the first context model and the second context model corresponding to a same index in the context model list.

DETAILED DESCRIPTION OF THE EMBODIMENTS

Figure 1:
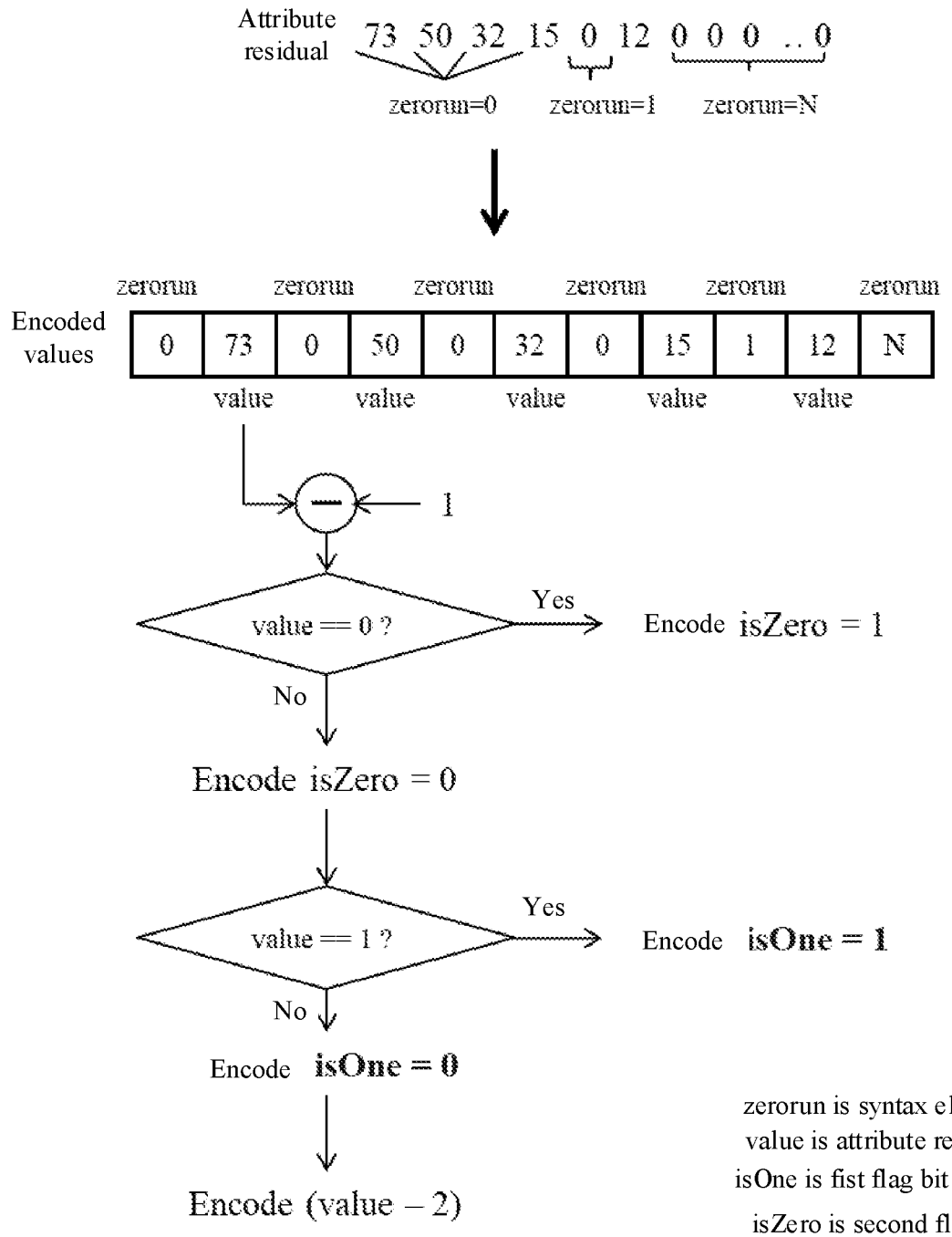
FIG. 1 is a schematic flow chart of a zero run length encoding process.

The technical solutions in the embodiments of the present disclosure will be described below in conjunction with the drawings in the embodiments of the present disclosure. Obviously, the described embodiments are some of the embodiments of the present disclosure, but not all of the embodiments. Based on the embodiments in this disclosure, all other embodiments obtained by those of ordinary skill in the art without creative work shall fall within the scope of this disclosure.

Unless otherwise specified, all technical and scientific terms used in the embodiments of the present disclosure have the same meaning as commonly understood by those skilled in the technical field of the present disclosure. The terms used in this disclosure are only for the purpose of describing specific embodiments and are not intended to limit the scope of the present disclosure.

The data encoding method provided by various embodiments of the present disclosure may be applied to a data encoding device, and the data encoding device may be set on an intelligent terminal (such as a mobile phone, a tablet computer, etc.). In some embodiments, the embodiments of the present disclosure may be applied to an aircraft (such as an unmanned aerial vehicle). In other embodiments, the embodiments of the present disclosure may also be applied to other movable platforms (such as unmanned ships, unmanned vehicles, robots, etc.). The present disclosure has no limit on this.

The present disclosure provides a data encoding method to improve zero run length encoding of attribute transformation coefficients or attribute residual in point cloud encoding. A more comprehensive and effective construction method is provided for a context model used in arithmetic encoding of some syntax elements, which may improve the performance of attribute encoding in point cloud data without changing any coding complexity. Before the embodiments of the present disclosure are introduced, the context model in zero run length encoding and arithmetic encoding will be described first.

In one example, point cloud data is divided into two parts, geometry and attributes, for encoding respectively. When attributes are being encoded, attribute values are converted into transform coefficients or attribute residual through transformation or prediction, and then quantization and entropy encoding are performed on the transform coefficients or attribute residual. After transformation/prediction, a probability distribution of the original attribute information is changed. When the prediction method is reasonable and the prediction is relatively accurate, the obtained attribute residual distribution will be around 0 (ideally all residuals are 0). Therefore, a zero run length encoding method is mainly used for attribute encoding. This encoding method will perform statistics on whether the attribute residual or transform coefficient string sent to the encoder is 0. A zero run syntax element is used to record the number of consecutive occurrences of 0 for continuous 0 and residual encoding is not performed on these 0s. For non-zero values, zero run is naturally not equal to 0, and residual encoding needs to be performed on these non-zero values. For the non-zero attribute residual, instead of directly performing entropy encoding, the following operations are performed: subtracting 1 from the attribute residual; determining whether it is 0 after subtracting 1; when it is zero, setting a second flag bit "isZero" to 1, and ending the encoding of this value; when it is not 0 after subtracting 1, setting the second flag bit "isZero" to 0, and determining whether the attribute residual is 1; when it is 1, setting a first flag bit "isOne" to 1, and ending the encoding of the attribute residual; otherwise setting the first flag bit "isOne" to 0, and encoding the value obtained by subtracting 2 from the attribute residual (if this step is reached, that means the attribute residual is certainly not equal to 0 or 1 or 2, and hence 2 can be subtracted therefrom).

FIG. 1 is a flow chart of a zero run length encoding method in one example. As shown in FIG. 1, assuming that the attribute residual of one channel of the current point cloud point in the point cloud data to be encoded are: 73, 50, 32, 15, 0, 12, 0, 0, 0, . . . , 0, since all the initial values are not zero, all values of zero run are 0. When there are N consecutive zeros, the value of zero run is N. As shown in FIG. 1, the attribute residuals of a channel of the current point cloud point in the point cloud data to be encoded, which are 73, 50, 32, 15, 0, 12, 0, 0, 0, . . . , 0, are encoded to obtain code values after adding zero runs of: 0, 73, 0, 50, 0, 32, 0, 15, 1, 12, N. Then the encoded values, 0, 73, 0, 50, 0, 32, 0, 15, 1, 12, N, are binarized to obtain a binary code for indicating the first flag bit and/or the second flag bit. In some examples, the first flag bit may be "isOne," and the second flag bit may be "isZero."

In one example, when the encoded values, 0, 73, 0, 50, 0, 32, 0, 15, 1, 12, N, are binarized, zero run is binarized using truncated unary code and then sent to an arithmetic encoder for encoding. For the two 1-bit flags of "isZero" and "isOne," corresponding context models are constructed, and then arithmetic encoding is performed according to the context models. Since the attribute residuals generally have three channels (such as RGB, YUV, etc.), the attribute residuals of an encoded channel may be used to construct the context.

In one example, the attribute residuals of the three channels are respectively denoted as C1, C2, and C3. When encoding "isZero" and "isOne" of C1, there is no context model to refer to. When encoding "isZero" and "isOne" of C2, whether the value of C1 is zero is used as a reference and two different context models are constructed according to whether the value of C1 is zero. In the same way, when encoding "isZero" and "isOne" of C3, whether values of C1 and C2 are zero is used as a reference, and correspondingly there are four context models. Therefore, "isZero" and "isOne" each have seven context models for selection, as shown in Table 1, which is a table constructed by an existing context model.

In some embodiments, the three channels of the attribute residual may include RGB, where R is a red channel, G is a green channel, and B is a blue channel. In some examples, the three channels of the attribute residual may include YUV, where Y is a luminance channel, and U and V are chrominance channels.

In arithmetic encoding, the symbol information of the encoded syntax elements is also called context. The accurate use of context information is obviously beneficial to improve the efficiency of attribute encoding. The statistical information (mainly probability distribution) of appropriate context information is the context model.

TABLE 1

|    |   | isZero           | isOne            |
|----|---|------------------|------------------|
| C1 | 0 | /                | /                |
| C2 | 1 | C1 == 0          | C1 == 0          |
|    | 2 | C1 != 0          | C1 != 0          |
| C3 | 3 | C1 == 0, C2 == 0 | C1 == 0, C2 == 0 |
|    | 4 | C1 == 0, C2 != 0 | C1 == 0, C2 != 0 |
|    | 5 | C1 != 0, C2 == 0 | C1 != 0, C2 == 0 |
|    | 6 | C1 != 0, C2 != 0 | C1 != 0, C2 != 0 |

In the existing technologies, the context model selection method of "isOne" and "isZero" have the same conditions, that is, whether the value of the encoded channels is 0. Statistic correlation between whether the encoded value is 0 and whether the value is 1 is not so strong. Therefore, the existing "isOne" context model is not optimized, and the "isOne" context model selection is unreasonable.

The present disclosure provides a method, a device, and a storage medium for data encoding/decoding, to alleviate above problems at least partially. In the present disclosure, a new context model construction method may be established for the flag bit of "isOne" and the context model construction method of "isZero" may remain unchanged. The context models of each of the two flag bits may be still maintained at 7. Therefore, the total average code length of the arithmetic encoding of the "isOne" flag bit may be shortened without increasing additional complexity, and the performance and efficiency of point cloud data attribute encoding may be improved.

Figure 2:
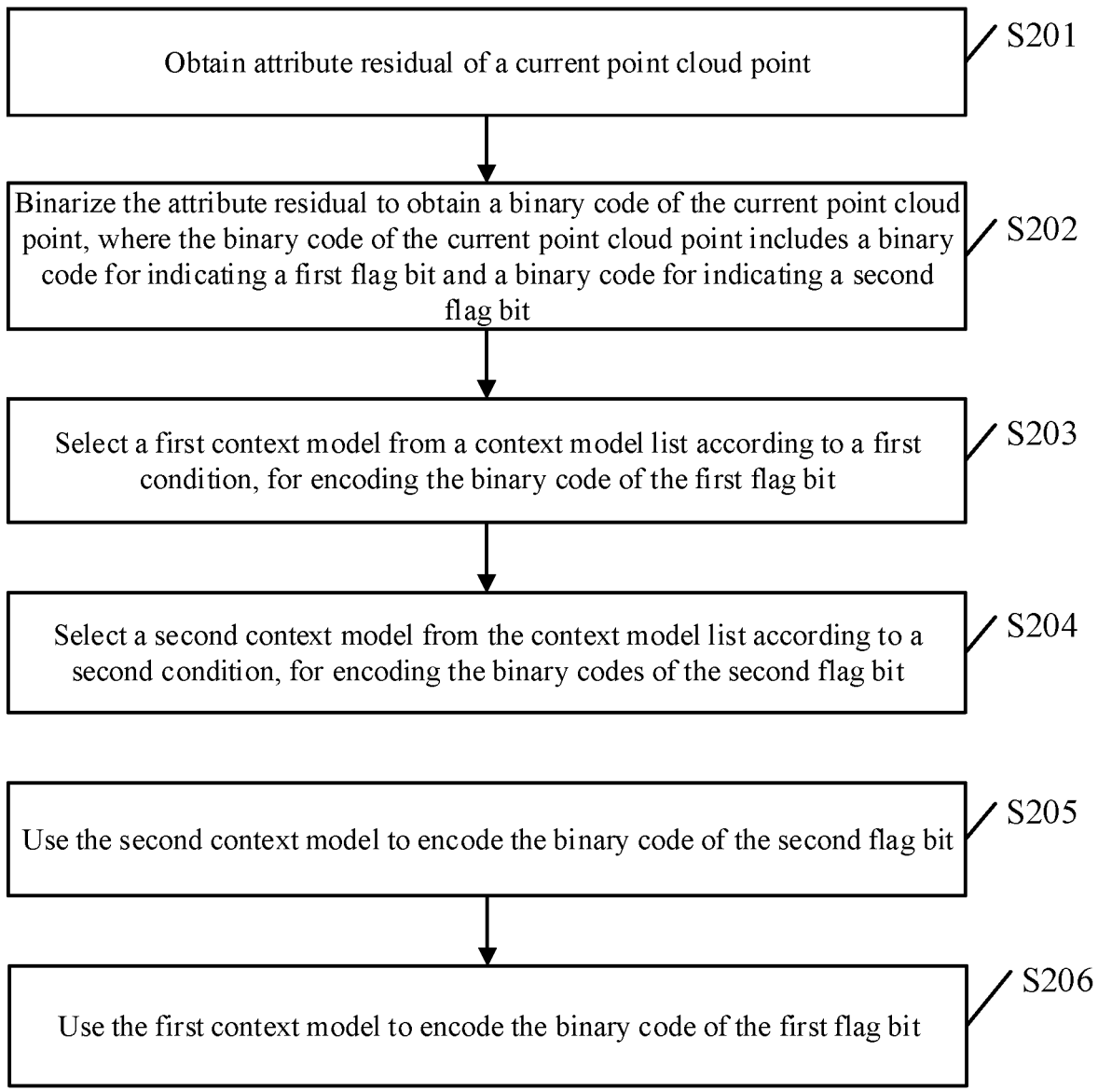
FIG. 2 is a schematic flow chart of a data encoding process consistent with the present disclosure.

The present disclosure provides a data encoding method. FIG. 2 is a flow chart of a data encoding method provided by one embodiment of the present disclosure. The method may be applied to a data encoding device as described above. As shown in FIG. 2, the method includes S201 to S203.

At S201, attribute residual of a current point cloud point is obtained.

In one embodiment, the data encoding device may obtain the attribute residual of the current point cloud point.

In some embodiments, the attribute residual of the current point cloud point may include attribute residual of a first channel, attribute residual of a second channel, or attribute residual of a third channel.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In some embodiments, the attribute residual of the current point cloud point may be values greater than or equal to zero.

At S202, the attribute residual is binarized to obtain a binary code of the current point cloud point. The binary code of the current point cloud point may include a binary code for indicating a first flag bit and a binary code for indicating a second flag bit.

In one embodiment, the data encoding device may binarize the attribute residual to obtain the binary code of the current point cloud point. The binary code of the current point cloud point may include the binary code for indicating the first flag bit and the binary code for indicating the second flag bit.

In some embodiments, the binary code of the current point cloud point may include the binary code of the attribute residual of the first channel, the binary code of the attribute residual of the second channel, or the binary code of the attribute residual of the third channel. In some embodiments, the first channel, the second channel, and the third channel may be different channels.

In some embodiments, the first flag bit may be used to indicate whether the attribute residual of one channel of the current point cloud point is N+1, and the second flag bit may be used to indicate whether the attribute residual of one channel of the current point cloud point is N, where N is greater than or equal to 0.

In an example, the first flag bit may be used to indicate whether the attribute residual of one channel of the current point cloud point is 2, and the second flag bit may be used to indicate whether the attribute residual of one channel of the current point cloud point is 1.

In some embodiments, when the attribute residual of the first channel, the second channel, and the third channel is the same and is not equal to 0, the second flag bit in the binary code of the attribute residual of the first channel may be used to indicate whether the attribute residual of the first channel is 1; or, the first flag bit of the binary code of the attribute residual of the first channel may be used to indicate whether the attribute residual of the first channel is 2.

In some embodiments, when the attribute residual of the first channel, the second channel, and the third channel is not completely the same, the second flag bit of the binary code of the attribute residual of the first channel may be used to indicate whether the attribute residual of the first channel is 0; or, the first flag bit of the binary code of the attribute residual of the first channel is used to indicate whether the attribute residual of the first channel is 1.

In some embodiments, when the attribute residual of the first channel is less than or equal to 1, the second flag bit of the binary code used to indicate the attribute residual of the first channel may be included. When the attribute residual of the first channel is greater than or equal to 2, the second flag bit and the first flag bit of the binary code used to indicate the attribute residual of the first channel may be included.

In one embodiment, when the data encoding device binarizes the attribute residual to obtain the binary code of the current point cloud point, it may encode the attribute residual of the current point cloud point according to a preset encoding method, to obtain encoded values, and then and the encoded values may be binarized to obtain the binary code of the current point cloud point.

In one embodiment, when the data encoding device encode the attribute residual of the current point cloud point according to the preset encoding method to obtain the encoded values, the zero run length encoding method may be used. For repeated and consecutive occurrences of 0s in the attribute residual of a channel of the current point cloud point, a zero run syntax element may be used to record the number of consecutive occurrences of 0s, and the residual encoding may be no longer performed on these 0s. For non-zero values of the attribute residual in a channel, zero run may be naturally equal to 0, and these non-zero values may need to be encoded to obtain the encoded values of the attribute residual of the channel.

In one example shown in FIG. 1, assuming that the attribute residuals of the first channel of the current point cloud point are 73, 50, 32, 15, 0, 12, 0, 0, 0, . . . , 0, the attribute residuals of the first channel include N consecutive zeros, and the zero run length encoding method may be used to encode the attribute residuals of the first channel, 73, 50, 32, 15, 0, 12, 0, 0, 0, . . . , 0, and the obtained encoded values are: 0, 73, 0, 50, 0, 32, 0, 15, 1, 12, N.

In one embodiment, when the data encoding device binarizes the encoded values to obtain the binary code of the current point cloud point, it may not directly perform entropy encoding on the encoded values of the non-zero attribute residual. Instead, it may perform the operations including: subtracting 1 from an attribute residual; determining whether the attribute residual is 0 after subtracting 1; when the attribute residual is 0 after subtracting 1, setting the second flag bit "isZero" to 1, and ending the encoding of this value; when the attribute residual is not 0 after subtracting 1, setting the second flag bit "isZero" to 0, and determining whether the attribute residual is 1 after subtracting 1; when the attribute residual is 1 after subtracting 1, setting the first flag bit "isOne" to 1, and ending the encoding of the value; when the attribute residual is not 1 after subtracting 1, setting the first flag bit "isOne" to 0, and performing arithmetic encoding on the value after subtracting 2 from the value.

In one example shown in FIG. 1, the attribute residual of the first channel of the current point cloud point is 73, 50, 32, 15, 0, 12, 0, 0, 0, . . . , 0, and the obtained encoded values are: 0, 73, 0, 50, 0, 32, 0, 15, 1, 12, N. The data encoding device may binarize the encoded values 0, 73, 0, 50, 0, 32, 0, 15, 1, 12, and N. In the process of binarization, the values of 73, 50, 32, and 15 after subtracting 1 are all not 1, the first flag bit "isOne" corresponding to 73, 50, 32, and 15 respectively may be set to 0. Since 1 in the encoded values is 0 after subtracting 1, the second flag bit "isZero" corresponding to 1 may be set to 1. The remaining encoding values of 0 may be not encoded. Therefore, the binary code of the attribute residual of the first channel of the current point cloud point composed of 0 and 1 may be obtained.

Through this implementation, the attribute residual of the current point cloud point may be binarized, and the binary code including the first flag bit and the second flag bit may be obtained. The process of binarization may be simplified to reduce the complexity of the binarization, which may be beneficial to selecting the corresponding context model according to different flag bits during subsequent encoding to encode the binary code corresponding to different flag bits. The encoding efficiency may be improved.

At S203, a first context model for encoding the binary code of the first flag bit is selected from a context model list according to a first condition.

In one embodiment, the data encoding device may select the first context model for encoding the binary code of the first flag bit from the context model list according to the first condition.

In one embodiment, when the data encoding device selects the first context model for encoding the binary code of the first flag bit from the context model list according to the first condition, it may select the first context model for encoding the binary code of the first flag bit of the attribute residual of the second channel from the context model list according to whether the attribute residual of the first channel of the current point cloud point is larger than a first preset threshold. The first preset threshold may be larger than 0. In some other embodiments, the first preset threshold may be larger than or equal to 1. In some embodiment, each of the first flag bit and the second bit of the attribute residual of the first channel may have one context model. In some embodiments, each of the first flag bit and the second bit of the attribute residual of the second channel may have two context models.

In one embodiment, when the attribute residual of the first channel of the current point cloud point is larger than the first preset threshold, the selected first context model for encoding the binary code of the first flag bit of the attribute residual of the second channel may be a context model in the context model list corresponding to a first index. When the attribute residual of the first channel of the current point cloud point is not larger than the first preset threshold, the selected first context model for encoding the binary code of the first flag bit of the attribute residual of the second channel may be a context model in the context model list corresponding to a second index.

In one example shown in Table 2, which is a table for constructing the context model provided by one embodiment of the present disclosure, the first preset threshold is larger than or equal to 1, the attribute residual of the first channel is C1, the attribute residual of the second channel is C2. When the attribute residual C1 of the first channel of the current point cloud point is larger than 1, the selected first context model for encoding the binary code of the first flag bit "isOne" of the attribute residual C2 of the second channel is the first context model corresponding o the first index (that is, the index 2) in the context model list. When the attribute residual C1 of the first channel of the current point cloud point is less than or equal to 1, the selected first context model for encoding the binary code of the first flag bit "isOne" of the attribute residual C2 of the second channel is the first context model corresponding o the second index (that is, the index 1) in the context model list.

TABLE 2

|    |   | isZero            | isOne              |
|----|---|-------------------|--------------------|
| C1 | 0 | /                 | /                  |
| C2 | 1 | C1 == 0           | C1 <= 1            |
|    | 2 | C1 != 0           | C1 > 1             |
| C3 | 3 | C1 == 0, C2 == 0  | C1 <= 1, C2 <= 1   |
|    | 4 | C1 == 0, C2 != 0  | C1 <= 1, C2 > 1    |
|    | 5 | C1 != 0, C2 == 0  | C1 > 1, C2 <= 1    |
|    | 6 | C1 != 0, C2 != 0  | C1 > 1, C2 > 1     |

In one embodiment, when the attribute residual of the first channel of the current point cloud point is not equal to the first preset threshold, the selected first context model for encoding the binary code of the first flag bit of the attribute residual of the second channel may be a context model in the context model list corresponding to a first index. When the attribute residual of the first channel of the current point cloud point is equal to the first preset threshold, the selected first context model for encoding the binary code of the first flag bit of the attribute residual of the second channel may be a context model in the context model list corresponding to a second index.

In one example shown in Table 3, which is a table for constructing the context model provided by one embodiment of the present disclosure, the first preset threshold is equal to 1, the attribute residual of the first channel is C1, the attribute residual of the second channel is C2. When the attribute residual C1 of the first channel of the current point cloud point is not equal to 1, the selected first context model for encoding the binary code of the first flag bit "isOne" of the attribute residual C2 of the second channel is the first context model corresponding o the first index (that is, the index 2) in the context model list. When the attribute residual C1 of the first channel of the current point cloud point is equal to 1, the selected first context model for encoding the binary code of the first flag bit "isOne" of the attribute residual C2 of the second channel is the first context model corresponding o the second index (that is, the index 1) in the context model list.

TABLE 3

|    |   | isZero            | isOne             |
|----|---|-------------------|-------------------|
| C1 | 0 | /                 | /                 |
| C2 | 1 | C1 == 0           | C1 == 1           |
|    | 2 | C1 != 0           | C1 != 1           |
| C3 | 3 | C1 == 0, C2 == 0  | C1 == 1, C2 != 1  |
|    | 4 | C1 == 0, C2 != 0  | C1 == 1, C2 == 1  |
|    | 5 | C1 != 0, C2 == 0  | C1 != 1, C2 == 1  |
|    | 6 | C1 != 0, C2 != 0  | C1 != 1, C2 != 1  |

In one embodiment, when the data encoding device selects the first context model for encoding the binary code of the first flag bit of the attribute residual of the second channel from the context model list according to whether the attribute residual of the first channel of the current point cloud point is larger than a first preset threshold, it may determine whether the attribute residual of the first channel of the current point cloud point is larger than the first preset threshold and whether the attribute residual of the third channel of the current point cloud point is larger than the first preset threshold, and then select the first context model for encoding the binary code of the first flag bit of the attribute residual of the second channel from the context model list according to the determination results. In some embodiment, each of the first flag bit and the second bit of the attribute residual of the first channel may have one context model. In some embodiment, each of the first flag bit and the second bit of the attribute residual of the second channel may have two context model. In some embodiments, each of the first flag bit and the second bit of the attribute residual of the second channel may have four context models.

In one embodiment, when the attribute residual of the first channel of the current point cloud point is smaller than or equal to the first preset threshold and the attribute residual of the third channel of the current point cloud point is smaller than or equal to the first preset threshold, the selected first context model for encoding the binary code of the first flag bit of the attribute residual of the second channel may be a context model in the context model list corresponding to a third index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point is smaller than or equal to 1 and the attribute residual C2 of the third channel of the current point cloud point is smaller than or equal to 1, the selected first context model for encoding the binary code of the first flag bit "isOne" of the attribute residual C3 of the second channel is the first context model corresponding o the third index (that is, the index 3) in the context model list.

In one embodiment, when the attribute residual of the first channel of the current point cloud point is equal to the first preset threshold and the attribute residual of the third channel of the current point cloud point is not equal to the first preset threshold, the selected first context model for encoding the binary code of the first flag bit of the attribute residual of the second channel may be a context model in the context model list corresponding to a third index.

In one example shown in Table 3, the first preset threshold is equal to 1, the attribute residual of the first channel is C1, the attribute residual of the second channel is C3, and the attribute residual of the third channel is C2. When the attribute residual C1 of the first channel of the current point cloud point is equal to 1 and the attribute residual C2 of the third channel of the current point cloud point is not equal to 1, the selected first context model for encoding the binary code of the first flag bit "isOne" of the attribute residual C3 of the second channel is the first context model corresponding o the third index (that is, the index 3) in the context model list.

In one embodiment, when the attribute residual of the first channel of the current point cloud point is smaller than or equal to the first preset threshold and the attribute residual of the third channel of the current point cloud point is larger than the first preset threshold, the selected first context model for encoding the binary code of the first flag bit of the attribute residual of the second channel may be a context model in the context model list corresponding to a fourth index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point is smaller than or equal to 1 and the attribute residual C2 of the third channel of the current point cloud point is larger than 1, the selected first context model for encoding the binary code of the first flag bit "isOne" of the attribute residual C3 of the second channel is the first context model corresponding o the fourth index (that is, the index 4) in the context model list.

In one embodiment, when the attribute residual of the first channel of the current point cloud point is equal to the first preset threshold and the attribute residual of the third channel of the current point cloud point is equal to the first preset threshold, the selected first context model for encoding the binary code of the first flag bit of the attribute residual of the second channel may be a context model in the context model list corresponding to a fourth index.

In one example shown in Table 3, the first preset threshold is equal to 1, the attribute residual of the first channel is C1, the attribute residual of the second channel is C3, and the attribute residual of the third channel is C2. When the attribute residual C1 of the first channel of the current point cloud point is equal to 1 and the attribute residual C2 of the third channel of the current point cloud point is equal to 1, the selected first context model for encoding the binary code of the first flag bit "isOne" of the attribute residual C3 of the second channel is the first context model corresponding o the fourth index (that is, the index 4) in the context model list.

In one embodiment, when the attribute residual of the first channel of the current point cloud point is larger than the first preset threshold and the attribute residual of the third channel of the current point cloud point is smaller than or equal to the first preset threshold, the selected first context model for encoding the binary code of the first flag bit of the attribute residual of the second channel may be a context model in the context model list corresponding to a fifth index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point is larger than 1 and the attribute residual C2 of the third channel of the current point cloud point is smaller than or equal to 1, the selected first context model for encoding the binary code of the first flag bit "isOne" of the attribute residual C3 of the second channel is the first context model corresponding o the fifth index (that is, the index 5) in the context model list.

In one embodiment, when the attribute residual of the first channel of the current point cloud point is not equal to the first preset threshold and the attribute residual of the third channel of the current point cloud point is equal to the first preset threshold, the selected first context model for encoding the binary code of the first flag bit of the attribute residual of the second channel may be a context model in the context model list corresponding to a fifth index.

In one example shown in Table 3, the first preset threshold is equal to 1, the attribute residual of the first channel is C1, the attribute residual of the second channel is C3, and the attribute residual of the third channel is C2. When the attribute residual C1 of the first channel of the current point cloud point is not equal to 1 and the attribute residual C2 of the third channel of the current point cloud point is equal to 1, the selected first context model for encoding the binary code of the first flag bit "isOne" of the attribute residual C3 of the second channel is the first context model corresponding o the fifth index (that is, the index 5) in the context model list.

In one embodiment, when the attribute residual of the first channel of the current point cloud point is larger than the first preset threshold and the attribute residual of the third channel of the current point cloud point is larger than the first preset threshold, the selected first context model for encoding the binary code of the first flag bit of the attribute residual of the second channel may be a context model in the context model list corresponding to a sixth index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point is larger than 1 and the attribute residual C2 of the third channel of the current point cloud point is larger than 1, the selected first context model for encoding the binary code of the first flag bit "isOne" of the attribute residual C3 of the second channel is the first context model corresponding o the sixth index (that is, the index 6) in the context model list.

In one embodiment, when the attribute residual of the first channel of the current point cloud point is not equal to the first preset threshold and the attribute residual of the third channel of the current point cloud point is not equal to the first preset threshold, the selected first context model for encoding the binary code of the first flag bit of the attribute residual of the second channel may be a context model in the context model list corresponding to a sixth index.

In one example shown in Table 3, the first preset threshold is equal to 1, the attribute residual of the first channel is C1, the attribute residual of the second channel is C3, and the attribute residual of the third channel is C2. When the attribute residual C1 of the first channel of the current point cloud point is not equal to 1 and the attribute residual C2 of the third channel of the current point cloud point is not equal to 1, the selected first context model for encoding the binary code of the first flag bit "isOne" of the attribute residual C3 of the second channel is the first context model corresponding o the sixth index (that is, the index 6) in the context model list.

In some embodiments, the first index, the second index, the third index, the fourth index, the fifth index, and the sixth index may be different indexes.

Through this implementation manner, the context model of the binary code of the first flag bit may be optimized without adding additional complexity, and the average length of the binary code of the first flag bit may be shortened, which may help to improve the efficiency of encoding the binary code of the first flag bit subsequently.

At S204, a second context model for encoding the binary code of the second flag bit is selected from a context model list according to a second condition.

In one embodiment, the data encoding device may select the second context model for encoding the binary code of the second flag bit from the context model list according to the second condition. When the first context model and the second context model correspond to the same index in the context model list, the first condition and the second condition may be different from each other.

In some embodiments, the first context model and the second context model may respectively be context models used to encode the binary code of different flags of attribute residual of the same channel. In some embodiments, the first context model and the second context model may be context models corresponding to the same index in the context model list. In some other embodiments, the first context model and the second context model may be context models corresponding to different indexes in the context model list. In some embodiments, the index may include but is not limited to characters such as numbers and letters.

In one example, the first context model may be a context model corresponding to index 0 in the context model list used to encode the binary code of the first flag bit "isOne" of the attribute residual of the first channel; the second context model may be a context model corresponding to index 0 in the context model list used to encode the binary code of the second flag bit "isZero" of the attribute residual of the first channel.

In another example, the first context model may be a context model corresponding to index 0 in the context model list used to encode the binary code of the first flag bit "isOne" of the attribute residual of the second channel; the second context model may be a context model corresponding to index 0 in the context model list used to encode the binary code of the second flag bit "isZero" of the attribute residual of the second channel.

In one embodiment, when the data encoding device selects the second context model for encoding the binary code of the second flag bit from the context model list according to the first condition, it may select the second context model for encoding the binary code of the second flag bit of the attribute residual of the second channel from the context model list according to whether the attribute residual of the first channel of the current point cloud point is equal to a second preset threshold. The second preset threshold may be 0. In some embodiments, the first preset threshold and the second preset threshold may be same or difference, and the present disclosure has no limit on this.

In one embodiment, when the attribute residual of the first channel of the current point cloud point is equal to the second preset threshold, the selected second context model for encoding the binary code of the second flag bit of the attribute residual of the second channel may be a context model in the context model list corresponding to a second index. When the attribute residual of the first channel of the current point cloud point is not equal to the second preset threshold, the selected first context model for encoding the binary code of the first flag bit of the attribute residual of the second channel may be a context model in the context model list corresponding to a first index.

In one example shown in Table 2, the second preset threshold is different from the first preset threshold, the attribute residual of the first channel is C1, the attribute residual of the second channel is C2, and the second preset threshold is 0. When the attribute residual C1 of the first channel of the current point cloud point is equal to 0, the selected second context model for encoding the binary code of the second flag bit "isZero" of the attribute residual C2 of the second channel is the first context model corresponding to the index 1 in the context model list. When the attribute residual C1 of the first channel of the current point cloud point is not equal to 0, the selected second context model for encoding the binary code of the second flag bit "isZero" of the attribute residual C2 of the second channel is the first context model corresponding to the index 2 in the context model list.

In one embodiment, when the attribute residual of the first channel of the current point cloud point is equal to the second preset threshold and the attribute residual of the third channel of the current point cloud point is equal to the second preset threshold, the selected second context model for encoding the binary code of the second flag bit of the attribute residual of the second channel may be a context model in the context model list corresponding to a third index. When the attribute residual of the first channel of the current point cloud point is equal to the second preset threshold and the attribute residual of the third channel of the current point cloud point is not equal to the second preset threshold, the selected second context model for encoding the binary code of the second flag bit of the attribute residual of the second channel may be a context model in the context model list corresponding to a fourth index. When the attribute residual of the first channel of the current point cloud point is not equal to the second preset threshold and the attribute residual of the third channel of the current point cloud point is equal to the second preset threshold, the selected second context model for encoding the binary code of the second flag bit of the attribute residual of the second channel may be a context model in the context model list corresponding to a fifth index. When the attribute residual of the first channel of the current point cloud point is not equal to the second preset threshold and the attribute residual of the third channel of the current point cloud point is not equal to the second preset threshold, the selected second context model for encoding the binary code of the second flag bit of the attribute residual of the second channel may be a context model in the context model list corresponding to a sixth index.

In one example shown in Table 2, the second preset threshold is different from the first preset threshold, the attribute residual of the first channel is C1, the attribute residual of the second channel is C3, the attribute residual of the third channel is C2, and the second preset threshold is 0. When the attribute residual C1 of the first channel of the current point cloud point is equal to 0 and the attribute residual C2 of the third channel of the current point cloud point is equal to 0, the selected second context model for encoding the binary code of the second flag bit "isZero" of the attribute residual C2 of the second channel is the context model corresponding to the third index (the index 3) in the context model list.

In one embodiment, when the attribute residual of the first channel of the current point cloud point is smaller than or equal to the second preset threshold and the attribute residual of the third channel of the current point cloud point is smaller than or equal to the second preset threshold, the selected second context model for encoding the binary code of the second flag bit of the attribute residual of the second channel may be a context model in the context model list corresponding to the third index.

In one example shown in Table 4, which is another table for constructing the context model provided by one embodiment of the present disclosure, the second preset threshold is same as the first preset threshold, the attribute residual of the first channel is C1, the attribute residual of the second channel is C3, the attribute residual of the third channel is C2, and the second preset threshold is larger than or equal to 1. When the attribute residual C1 of the first channel of the current point cloud point is smaller than or equal to 1 and the attribute residual C2 of the third channel of the current point cloud point is smaller than or equal to 1, the selected second context model for encoding the binary code of the second flag bit "isZero" of the attribute residual C2 of the second channel is the context model corresponding to the third index (the index 3) in the context model list.

In one embodiment, when the attribute residual of the first channel of the current point cloud point is smaller than or equal to the second preset threshold and the attribute residual of the third channel of the current point cloud point is larger than the second preset threshold, the selected second context model for encoding the binary code of the second flag bit of the attribute residual of the second channel may be a context model in the context model list corresponding to the fourth index.

In one example shown in Table 4, the second preset threshold is same as the first preset threshold, the attribute residual of the first channel is C1, the attribute residual of the second channel is C3, the attribute residual of the third channel is C2, and the second preset threshold is larger than or equal to 1. When the attribute residual C1 of the first channel of the current point cloud point is smaller than or equal to 1 and the attribute residual C2 of the third channel of the current point cloud point is larger than 1, the selected second context model for encoding the binary code of the second flag bit "isZero" of the attribute residual C2 of the second channel is the context model corresponding to the fourth index (the index 4) in the context model list.

TABLE 4

|    |   | isZero          | isOne           |
|----|---|-----------------|-----------------|
| C1 | 0 | /               | /               |
| C2 | 1 | C1 <= 1         | C1 <= 1         |
|    | 2 | C1 > 1          | C1 > 1          |
| C3 | 3 | C1 <= 1, C2 <= 1 | C1 <= 1, C2 <= 1 |
|    | 4 | C1 <= 1, C2 > 1  | C1 <= 1, C2 > 1  |
|    | 5 | C1 > 1, C2 <= 1  | C1 > 1, C2 <= 1  |
|    | 6 | C1 > 1, C2 > 1   | C1 > 1, C2 > 1   |

In one embodiment, when the attribute residual of the first channel of the current point cloud point is larger than the second preset threshold and the attribute residual of the third channel of the current point cloud point is smaller than or equal to the second preset threshold, the selected second context model for encoding the binary code of the second flag bit of the attribute residual of the second channel may be a context model in the context model list corresponding to the fifth index.

In one example shown in Table 4, the second preset threshold is same as the first preset threshold, the attribute residual of the first channel is C1, the attribute residual of the second channel is C3, the attribute residual of the third channel is C2, and the second preset threshold is larger than or equal to 1. When the attribute residual C1 of the first channel of the current point cloud point is larger than 1 and the attribute residual C2 of the third channel of the current point cloud point is smaller than or equal to 1, the selected second context model for encoding the binary code of the second flag bit "isZero" of the attribute residual C2 of the second channel is the context model corresponding to the fifth index (the index 5) in the context model list.

In one embodiment, when the attribute residual of the first channel of the current point cloud point is larger than the second preset threshold and the attribute residual of the third channel of the current point cloud point is larger than the second preset threshold, the selected second context model for encoding the binary code of the second flag bit of the attribute residual of the second channel may be a context model in the context model list corresponding to the sixth index.

In one example shown in Table 4, the second preset threshold is same as the first preset threshold, the attribute residual of the first channel is C1, the attribute residual of the second channel is C3, the attribute residual of the third channel is C2, and the second preset threshold is larger than or equal to 1. When the attribute residual C1 of the first channel of the current point cloud point is larger than 1 and the attribute residual C2 of the third channel of the current point cloud point is larger than 1, the selected second context model for encoding the binary code of the second flag bit "isZero" of the attribute residual C2 of the second channel is the context model corresponding to the sixth index (the index 6) in the context model list.

Through this implementation manner, the context model of the binary code of the second flag bit may be optimized without adding additional complexity, which may help to improve the efficiency of encoding the binary code of the second flag bit subsequently.

At S205, the second context model is used to encode the binary code of the second flag bit.

In one embodiment, the data encoding device may use the second context model selected for encoding the binary code of the second flag bit from the context model list according to the second condition, to encode the binary code of the second flag bit.

In one embodiment, the zero run length encoding method may be used to encode the attribute residual, the second flag bit may be obtained, or, the second flag bit and the first flag bit may be obtained by encoding.

In one embodiment, when the attribute residual is encoded using the zero run length encoding method to obtain the second flag bit and the first flag bit, the second flag bit and the first flag bit may be obtained in sequence according to the zero run length encoding sequence. Therefore, when the data encoding device encodes the current point cloud point, it may first use the second context model to encode the binary code of the second flag bit, and then use the first context model to encode the binary code of the first flag bit.

At S206, the first context model is used to encode the binary code of the first flag bit.

In one embodiment, the data encoding device may use the first context model selected for encoding the binary code of the first flag bit from the context model list according to the first condition, to encode the binary code of the first flag bit.

In the present disclosure, the data encoding device may binarize the attribute residual of the current point cloud point to obtain the binary code for indicating the first flag bit and the binary code for indicating the second flag bit. Then the first context model for encoding the binary code of the first flag bit may be selected from the context model list according to the first condition, and the first context model may be used to encode the binary code of the first flag bit. The second context model for encoding the binary code of the second flag bit may be selected from the context model list according to the second condition, and the second context model may be used to encode the binary code of the second flag bit. Through this implementation manner, the encoding efficiency may be improved without adding additional complexity.

Figure 3:
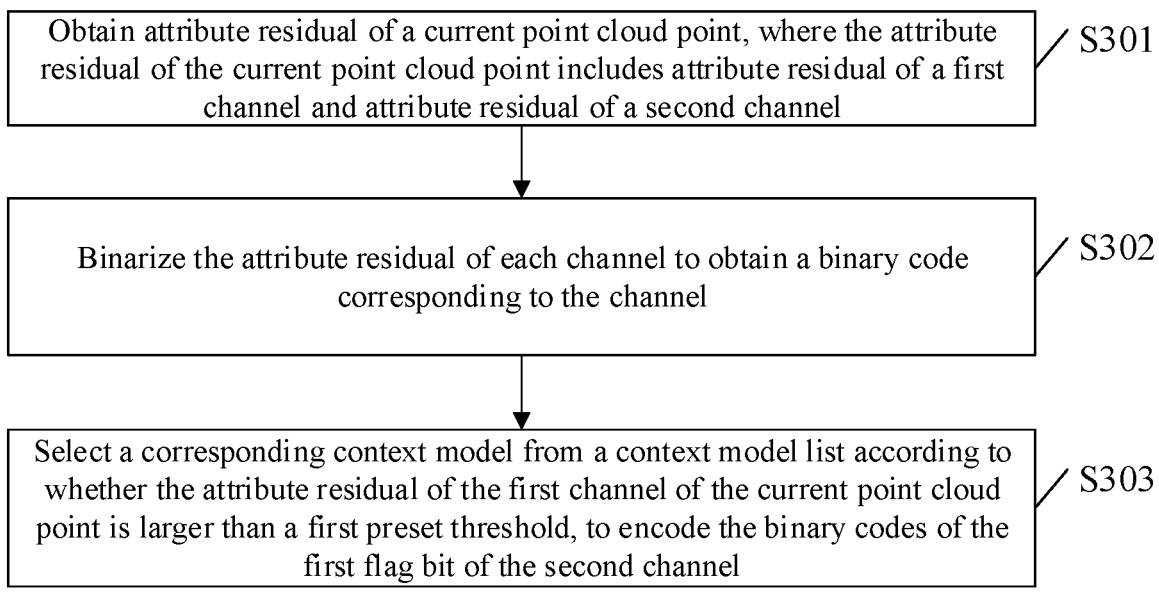
FIG. 3 is a schematic flow chart of another data encoding method consistent with the present disclosure.

The present disclosure provides another data encoding method. FIG. 3 is a flow chart of a data encoding method provided by one embodiment of the present disclosure. The method may be applied to a data encoding device as described above. As shown in FIG. 3, the method includes S201 to S303.

At S301, attribute residual of a current point cloud point is obtained. The attribute residual of the current point cloud point may include attribute residual of a first channel and attribute residual of a second channel.

In one embodiment, the data encoding device may obtain the attribute residual of the current point cloud point. In some embodiments, the attribute residual of the current point cloud point may include attribute residual of a first channel and attribute residual of a second channel. In some other embodiments, the attribute residual may further include attribute residual of a third channel.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In some embodiments, the attribute residual of the current point cloud point may be values greater than or equal to zero.

At S302, the attribute residual of each channel is binarized to obtain a binary code corresponding to the channel. The binary code corresponding to the second channel may include a binary code for indicating a first flag bit.

In one embodiment, the data encoding device may binarize the attribute residual of each channel to obtain the binary code of each channel. The binary code corresponding to the second channel may include a binary code for indicating a first flag bit. In some embodiments, the first flag bit may be used to indicate whether the attribute residual of the second channel of the current point cloud point is N, where N is greater than or equal to 0. In one embodiment, the first flag bit may be used to indicate whether the attribute residual of the second channel of the current point cloud point is 2.

In one embodiment, when the data encoding device binarizes the attribute residual of each channel to obtain the binary code corresponding to the channel, it may encode the attribute residual of each channel according to a preset encoding method, to obtain encoded values, and then the encoded values may be binarized to obtain the binary code corresponding to the channel.

In one embodiment, when the data encoding device encodes the attribute residual of the current point cloud point according to the preset encoding method to obtain the encoded values, the zero run length encoding method may be used. For repeated and consecutive occurrences of 0s in the attribute residual of a channel of the current point cloud point, a zero run syntax element may be used to record the number of consecutive occurrences of 0s, and the residual encoding may be no longer performed on these 0s. For non-zero values of the attribute residual in a channel, zero run may be naturally equal to 0, and these non-zero values may need to be encoded to obtain the encoded values of the attribute residual of the channel.

In one embodiment, when the data encoding device binarizes the encoded values to obtain the binary code of the current point cloud point, it may not directly perform entropy encoding on the encoded values of these non-zero attribute residual. Instead, it may perform the operations including: subtracting 1 from an attribute residual; determining whether the attribute residual is 0 after subtracting 1; when the attribute residual is 0 after subtracting 1, setting the second flag bit "isZero" to 1, and ending the encoding of this value; when the attribute residual is not 0 after subtracting 1, setting the second flag bit "isZero" to 0, and determining whether the attribute residual is 1 after subtracting 1; when the attribute residual is 1 after subtracting 1, setting the first flag bit "isOne" to 1, and ending the encoding of the value; when the attribute residual is not 1 after subtracting 1, setting the first flag bit "isOne" to 0, and performing arithmetic encoding on the value after subtracting 2 from the value.

In some embodiments, the binary code of the current point cloud point may include the binary code of the attribute residual of the first channel, the binary code of the attribute residual of the second channel, and the binary code of the attribute residual of the third channel. In some embodiments, the first channel, the second channel, and the third channel may be different channels.

Through this implementation, the attribute residual of the current point cloud point may be binarized, and the binary code including the first flag bit and the second flag bit may be obtained. The process of binarization may be simplified to reduce the complexity of the binarization, which may be beneficial to selecting the corresponding context model according to different flag bits during subsequent encoding to encode the binary code corresponding to different flag bits. The encoding efficiency may be improved.

At S303, a corresponding context model is selected from a context model list according to whether the attribute residual of the first channel of the current point cloud point is larger than a first preset threshold to encode the binary code of the first flag bit of the second channel.

In one embodiment, the data encoding device may select the first context model for encoding the binary code of the first flag bit of the attribute residual of the second channel from the context model list according to whether the attribute residual of the first channel of the current point cloud point is larger than the first preset threshold. The first preset threshold may be larger than 0. In some other embodiments, the first preset threshold may be larger than or equal to 1.

In one embodiment, when the data encoding device selects the first context model for encoding the binary code of the first flag bit of the attribute residual of the second channel from the context model list according to whether the attribute residual of the first channel of the current point cloud point is larger than the first preset threshold, whether the attribute residual of the first channel of the current point cloud point is larger than the first preset threshold may be determined. When it is determined that the attribute residual of the first channel of the current point cloud point is not larger than the first preset threshold, the first context model corresponding to a first index may be selected from the context model list, for encoding the binary code of the first flag bit of the attribute residual of the second channel. When it is determined that the attribute residual of the first channel of the current point cloud point is larger than the first preset threshold, the first context model corresponding to a second index may be selected from the context model list, for encoding the binary code of the first flag bit of the attribute residual of the second channel.

In one embodiment, when it is determined that the attribute residual of the first channel of the current point cloud point is larger than the first preset threshold, the context model corresponding to the first index may be selected from the context model list, for encoding the binary code of the first flag bit of the attribute residual of the second channel. When the attribute residual of the first channel of the current point cloud point is not larger than the first preset threshold, the context model corresponding to the second index may be selected from the context model list, for encoding the binary code of the first flag bit of the attribute residual of the second channel.

In one example shown in Table 2, the first preset threshold is larger than or equal to 1, the attribute residual of the first channel is C1, the attribute residual of the second channel is C2. When the attribute residual C1 of the first channel of the current point cloud point is larger than 1, the selected first context model for encoding the binary code of the first flag bit "isOne" of the attribute residual C2 of the second channel is the first context model corresponding o the first index (that is, the index 2) in the context model list, and the binary code of the first flag bit "isOne" of the attribute residual C2 of the second channel is encoded. When the attribute residual C1 of the first channel of the current point cloud point is less than or equal to 1, the selected first context model for encoding the binary code of the first flag bit "isOne" of the attribute residual C2 of the second channel is the first context model corresponding o the second index (that is, the index 1) in the context model list, and the binary code of the first flag bit "isOne" of the attribute residual C2 of the second channel.

In one embodiment, the binary code corresponding to the second channel may further include the binary code for indicating the second flag bit. The data encoding device may select the second context model for encoding the binary code of the second flag bit of the attribute residual of the second channel from the context model list according to whether the attribute residual of the first channel of the current point cloud point is equal to a second preset threshold. The second preset threshold may be 0. In some embodiments, the first preset threshold and the second preset threshold may be same or difference, and the present disclosure has no limit on this.

In one embodiment, when the attribute residual of the first channel of the current point cloud point is equal to the second preset threshold, the selected second context model for encoding the binary code of the second flag bit of the attribute residual of the second channel may be a context model in the context model list corresponding to a second index. When the attribute residual of the first channel of the current point cloud point is not equal to the second preset threshold, the selected first context model for encoding the binary code of the first flag bit of the attribute residual of the second channel may be a context model in the context model list corresponding to a first index.

In one embodiment, when the attribute residual of the first channel of the current point cloud point is equal to the second preset threshold and the attribute residual of the third channel of the current point cloud point is equal to the second preset threshold, the selected second context model for encoding the binary code of the second flag bit of the attribute residual of the second channel may be a context model in the context model list corresponding to a third index. When the attribute residual of the first channel of the current point cloud point is equal to the second preset threshold and the attribute residual of the third channel of the current point cloud point is not equal to the second preset threshold, the selected second context model for encoding the binary code of the second flag bit of the attribute residual of the second channel may be a context model in the context model list corresponding to a fourth index. When the attribute residual of the first channel of the current point cloud point is not equal to the second preset threshold and the attribute residual of the third channel of the current point cloud point is equal to the second preset threshold, the selected second context model for encoding the binary code of the second flag bit of the attribute residual of the second channel may be a context model in the context model list corresponding to a fifth index. When the attribute residual of the first channel of the current point cloud point is not equal to the second preset threshold and the attribute residual of the third channel of the current point cloud point is not equal to the second preset threshold, the selected second context model for encoding the binary code of the second flag bit of the attribute residual of the second channel may be a context model in the context model list corresponding to a sixth index.

In one embodiment, when the data encoding device selects the corresponding context model for encoding the binary code of the first flag bit of the attribute residual of the second channel from the context model list according to whether the attribute residual of the first channel of the current point cloud point is larger than the first preset threshold, whether the attribute residual of the first channel of the current point cloud point is larger than the first preset threshold and whether the attribute residual of the third channel of the current point cloud point is larger than the first preset threshold may be determined. The corresponding context model may be selected from the context model list according to the determination result, for encoding the binary code of the first flag bit of the attribute residual of the second channel.

In one embodiment, when the data encoding device selects the corresponding context model from the context model list according to the determination result, for encoding the binary code of the first flag bit of the attribute residual of the second channel, when the attribute residual of the first channel of the current point cloud point is smaller than or equal to the first preset threshold and the attribute residual of the third channel of the current point cloud point is smaller than or equal to the first preset threshold, the data encoding device may select the context model corresponding to the third index from the context model list, for encoding the binary code of the first flag bit of the attribute residual of the second channel.

In one example shown in Table 2, the second preset threshold is different from the first preset threshold, the attribute residual of the first channel is C1, the attribute residual of the second channel is C3, the attribute residual of the third channel is C2, and the first preset threshold is larger than or equal to 1. When the attribute residual C1 of the first channel of the current point cloud point is smaller than or equal to 1 and the attribute residual C2 of the third channel of the current point cloud point is smaller than or equal to 1, the selected second context model for encoding the binary code of the first flag bit "isOne" of the attribute residual C2 of the second channel is the context model corresponding to the third index (the index 3) in the context model list, and the binary code of the first flag bit "isOne" of the attribute residual C2 of the second channel is encoded.

In one embodiment, when the data encoding device selects the corresponding context model from the context model list according to the determination result, for encoding the binary code of the first flag bit of the attribute residual of the second channel, when the attribute residual of the first channel of the current point cloud point is smaller than or equal to the first preset threshold and the attribute residual of the third channel of the current point cloud point is larger the first preset threshold, the data encoding device may select the context model corresponding to the fourth index from the context model list, for encoding the binary code of the first flag bit of the attribute residual of the second channel.

In one example shown in Table 2, the second preset threshold is different from the first preset threshold, the attribute residual of the first channel is C1, the attribute residual of the second channel is C3, the attribute residual of the third channel is C2, and the first preset threshold is larger than or equal to 1. When the attribute residual C1 of the first channel of the current point cloud point is smaller than or equal to 1 and the attribute residual C2 of the third channel of the current point cloud point is larger than 1, the selected second context model for encoding the binary code of the first flag bit "isOne" of the attribute residual C2 of the second channel is the context model corresponding to the fourth index (the index 4) in the context model list, and the binary code of the first flag bit "isOne" of the attribute residual C2 of the second channel is encoded.

In one embodiment, when the data encoding device selects the corresponding context model from the context model list according to the determination result, for encoding the binary code of the first flag bit of the attribute residual of the second channel, when the attribute residual of the first channel of the current point cloud point is larger than the first preset threshold and the attribute residual of the third channel of the current point cloud point is smaller than or equal to the first preset threshold, the data encoding device may select the context model corresponding to the fifth index from the context model list, for encoding the binary code of the first flag bit of the attribute residual of the second channel.

In one example shown in Table 2, the second preset threshold is different from the first preset threshold, the attribute residual of the first channel is C1, the attribute residual of the second channel is C3, the attribute residual of the third channel is C2, and the first preset threshold is larger than or equal to 1. When the attribute residual C1 of the first channel of the current point cloud point is larger than 1 and the attribute residual C2 of the third channel of the current point cloud point is smaller than or equal to 1, the selected second context model for encoding the binary code of the first flag bit "isOne" of the attribute residual C2 of the second channel is the context model corresponding to the fifth index (the index 5) in the context model list, and the binary code of the first flag bit "isOne" of the attribute residual C2 of the second channel is encoded.

In one embodiment, when the data encoding device selects the corresponding context model from the context model list according to the determination result, for encoding the binary code of the first flag bit of the attribute residual of the second channel, when the attribute residual of the first channel of the current point cloud point is larger than the first preset threshold and the attribute residual of the third channel of the current point cloud point is larger than the first preset threshold, the data encoding device may select the context model corresponding to the sixth index from the context model list, for encoding the binary code of the first flag bit of the attribute residual of the second channel.

In one example shown in Table 2, the second preset threshold is different from the first preset threshold, the attribute residual of the first channel is C1, the attribute residual of the second channel is C3, the attribute residual of the third channel is C2, and the first preset threshold is larger than or equal to 1. When the attribute residual C1 of the first channel of the current point cloud point is larger than 1 and the attribute residual C2 of the third channel of the current point cloud point is larger than 1, the selected second context model for encoding the binary code of the first flag bit "isOne" of the attribute residual C2 of the second channel is the context model corresponding to the sixth index (the index 6) in the context model list, and the binary code of the first flag bit "isOne" of the attribute residual C2 of the second channel is encoded.

In one embodiment, the data encoding device may determine whether the attribute residual of the first channel of the current point cloud point is larger than the second preset threshold and whether the attribute residual of the third channel of the current point cloud point is larger than the first preset threshold, and then select the corresponding context model from the context model list according to the determination result, for encoding the binary code of the second flag bit of the attribute residual of the second channel.

In one embodiment, when the attribute residual of the first channel of the current point cloud point is smaller than or equal to the second preset threshold and the attribute residual of the third channel of the current point cloud point smaller than or equal to the second preset threshold, the selected context model for encoding the binary code of the second flag bit of the attribute residual of the second channel may be the context model corresponding to the third index in the context model list.

In one embodiment, when the attribute residual of the first channel of the current point cloud point is smaller than or equal to the second preset threshold and the attribute residual of the third channel of the current point cloud point is larger than the second preset threshold, the selected context model for encoding the binary code of the second flag bit of the attribute residual of the second channel may be the context model corresponding to the fourth index in the context model list.

In one embodiment, when the attribute residual of the first channel of the current point cloud point is larger than the second preset threshold and the attribute residual of the third channel of the current point cloud point is smaller than or equal to the second preset threshold, the selected context model for encoding the binary code of the second flag bit of the attribute residual of the second channel may be the context model corresponding to the fifth index in the context model list.

In one embodiment, when the attribute residual of the first channel of the current point cloud point is larger than the second preset threshold and the attribute residual of the third channel of the current point cloud point is larger than the second preset threshold, the selected context model for encoding the binary code of the second flag bit of the attribute residual of the second channel may be the context model corresponding to the sixth index in the context model list.

In some embodiments, the second flag bit of the binary code of the attribute residual of the first channel may be used to indicate whether the attribute residual of the first channel is 1; or, the first flag bit of the binary code of the attribute residual of the first channel may be used to indicate whether the attribute residual of the first channel is 2.

In some embodiments, the second flag bit of the binary code of the attribute residual of the first channel may be used to indicate whether the attribute residual of the first channel is 0; or, the first flag bit of the binary code of the attribute residual of the first channel may be used to indicate whether the attribute residual of the first channel is 1.

In the present disclosure, the data encoding device may binarize the attribute residual of each channel of the current point cloud point to obtain the binary code corresponding to the channel. The binary code corresponding to the second channel may include the binary code indicating the first flag bit. According to whether the attribute residual of the first channel of the current point cloud point is larger than the first preset threshold, the corresponding context model may be selected from the context model list, to encode the binary code of the first flag bit of the second channel. Through this implementation manner, the encoding efficiency may be improved without adding additional complexity.

Figure 4:
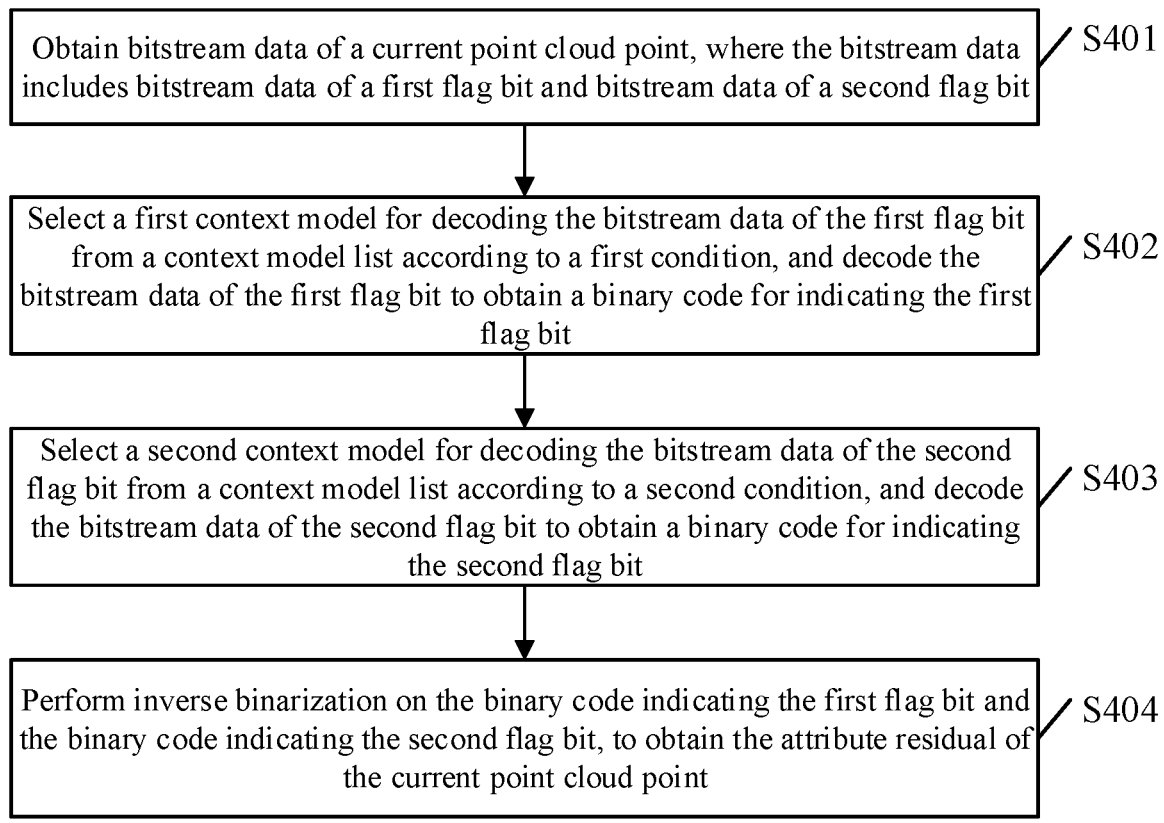
FIG. 4 is a schematic flow chart of a data decoding method consistent with the present disclosure.

The present disclosure also provides a data decoding method. In one embodiment shown in FIG. 4, the data decoding method may be applied to a data encoding device. The data decoding device may be set at a smart terminal (such as a cell phone, a tablet, etc.). As shown in FIG. 4, the method includes S401 to S404.

At S401, bitstream data of a current point cloud point is obtained. The bitstream data may include bitstream data of a first flag bit and bitstream data of a second flag bit.

In some embodiments, the bitstream data may include bitstream data of attribute residual of a first channel, bitstream data of attribute residual of a second channel, or bitstream data of attribute residual of a third channel.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In some embodiments, the first flag bit may be used to indicate whether the attribute residual of one channel of the current point cloud point is N+1, and the second flag bit may be used to indicate whether the attribute residual of one channel of the current point cloud point is N, where N is greater than or equal to 0.

In some embodiments, the first flag bit may be used to indicate whether the attribute residual of the first channel of the current point cloud point is 2, or the second flag bit may be used to indicate whether the attribute residual of the first channel of the current point cloud point is 1.

In some embodiments, the first flag bit may be used to indicate whether the attribute residual of the first channel of the current point cloud point is 1, or the second flag bit may be used to indicate whether the attribute residual of the first channel of the current point cloud point is 0.

At S402, a first context model for decoding the bitstream data of the first flag bit is selected from a context model list according to a first condition, and the bitstream data of the first flag bit is decoded to obtain a binary code for indicating the first flag bit.

In one embodiment, the data decoding device may select the first context model for decoding the bitstream data of the first flag bit from the context model list according to the first condition, and decode the bitstream data of the first flag bit to obtain the binary code indicating the first flag bit.

In one embodiment, when the data decoding device selects the first context model for decoding the bitstream data of the first flag bit from the context model list according to the first condition, it may decode the bitstream data of the attribute residual of the first channel to obtain the attribute residual of the first channel, and according to whether the attribute residual of the first channel is larger than a first preset threshold, select the first context model for decoding the bitstream data of the first flag bit from the context model list. The first preset threshold may be larger than zero. In some embodiments, the first preset threshold may be larger than or equal to 1. In some embodiments, each of the first flag bit and the second flag bit of the attribute residual of the first channel may have one context model. In some embodiments, each of the first flag bit and the second flag bit of the attribute residual of the second channel may respectively have two context models.

In one embodiment, when the attribute residual of the first channel of the current point cloud point is larger than the first preset threshold, the selected first context model for decoding the bitstream data of the first flag bit of the attribute residual of the second channel may be a context model in the context model list corresponding to a first index.

In one example shown in Table 2, the first preset threshold is larger than or equal to 1, the attribute residual of the first channel is C1, the attribute residual of the second channel is C2. When the attribute residual C1 of the first channel of the current point cloud point obtained by decoding the bitstream data of the attribute residual C1 of the first channel is larger than 1, the selected first context model for decoding the bitstream data of the first flag bit "isOne" of the attribute residual C2 of the second channel is the first context model corresponding to the first index (that is, the index 2) in the context model list.

In one embodiment, when the attribute residual of the first channel of the current point cloud point is not larger than the first preset threshold, the selected first context model for decoding the bitstream data of the first flag bit of the attribute residual of the second channel may be a context model in the context model list corresponding to a second index.

In one example shown in Table 2, the first preset threshold is larger than or equal to 1, the attribute residual of the first channel is C1, the attribute residual of the second channel is C2. When the attribute residual C1 of the first channel of the current point cloud point obtained by decoding the bitstream data of the attribute residual C1 of the first channel is smaller than or equal to 1, the selected first context model for decoding the bitstream data of the first flag bit "isOne" of the attribute residual C2 of the second channel is the first context model corresponding to the second index (that is, the index 1) in the context model list.

In one embodiment, when the data decoding device selects the first context model for decoding the bitstream data of the first flag bit of the attribute residual of the second channel from the context model list according to whether the attribute residual of the first channel of the current point cloud point is larger than the first preset threshold, it may determine whether the attribute residual of the first channel of the current point cloud point is larger than the first preset threshold and whether the attribute residual of the third channel is larger than the first preset threshold. Then the first context model for decoding the bitstream data of the first flag bit of the second channel may be selected from the context model list according to the determination result. In some embodiments, each of the first flag bit and the second flag bit of the attribute residual of the first channel may have one context model. In some embodiments, each of the first flag bit and the second flag bit of the attribute residual of the third channel may have two context models. In some embodiments, each of the first flag bit and the second flag bit of the attribute residual of the second channel may have four context models.

In one embodiment, when the attribute residual of the first channel of the current point cloud point is smaller than or equal to the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a third index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is smaller than or equal to 1 and the attribute residual C2 of the third channel is smaller than or equal to 1, the selected first context model for decoding the bitstream data of the first flag bit "isOne" of the attribute residual C3 of the second channel is the first context model corresponding to the third index (that is, the index 3) in the context model list.

In one embodiment, when the attribute residual of the first channel of the current point cloud point is equal to the first preset threshold and the attribute residual of the third channel of the current point cloud point is not equal to the first preset threshold, the selected first context model for decoding the bitstream data of the first flag bit of the attribute residual of the second channel may be a context model in the context model list corresponding to a third index.

In one example shown in Table 3, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is equal to 1 and the attribute residual C2 of the third channel is not equal to 1, the selected first context model for decoding the bitstream data of the first flag bit "isOne" of the attribute residual C3 of the second channel is the first context model corresponding to the third index (that is, the index 3) in the context model list.

In one embodiment, when the attribute residual of the first channel of the current point cloud point is smaller than or equal to the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a fourth index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is smaller than or equal to 1 and the attribute residual C2 of the third channel is larger than 1, the selected first context model for decoding the bitstream data of the first flag bit "isOne" of the attribute residual C3 of the second channel is the first context model corresponding to the fourth index (that is, the index 4) in the context model list.

In one embodiment, when the attribute residual of the first channel of the current point cloud point is equal to the first preset threshold and the attribute residual of the third channel of the current point cloud point is equal to the first preset threshold, the selected first context model for decoding the bitstream data of the first flag bit of the attribute residual of the second channel may be a context model in the context model list corresponding to a fourth index.

In one example shown in Table 3, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is equal to 1 and the attribute residual C2 of the third channel is equal to 1, the selected first context model for decoding the bitstream data of the first flag bit "isOne" of the attribute residual C3 of the second channel is the first context model corresponding to the fourth index (that is, the index 4) in the context model list.

In one embodiment, when the attribute residual of the first channel of the current point cloud point is larger the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a fifth index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is larger than 1 and the attribute residual C2 of the third channel is smaller than or equal to 1, the selected first context model for decoding the bitstream data of the first flag bit "isOne" of the attribute residual C3 of the second channel is the first context model corresponding to the fifth index (that is, the index 5) in the context model list.

In one embodiment, when the attribute residual of the first channel of the current point cloud point is not equal to the first preset threshold and the attribute residual of the third channel of the current point cloud point is equal to the first preset threshold, the selected first context model for decoding the bitstream data of the first flag bit of the attribute residual of the second channel may be a context model in the context model list corresponding to a fifth index.

In one example shown in Table 3, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is not equal to 1 and the attribute residual C2 of the third channel is equal to 1, the selected first context model for decoding the bitstream data of the first flag bit "isOne" of the attribute residual C3 of the second channel is the first context model corresponding to the fifth index (that is, the index 5) in the context model list.

In one embodiment, when the attribute residual of the first channel of the current point cloud point is larger the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a sixth index.

In one example shown in Table 2, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is larger than 1 and the attribute residual C2 of the third channel is larger than 1, the selected first context model for decoding the bitstream data of the first flag bit "isOne" of the attribute residual C3 of the second channel is the first context model corresponding to the sixth index (that is, the index 6) in the context model list.

In one embodiment, when the attribute residual of the first channel of the current point cloud point is not equal to the first preset threshold and the attribute residual of the third channel of the current point cloud point is not equal to the first preset threshold, the selected first context model for decoding the bitstream data of the first flag bit of the attribute residual of the second channel may be a context model in the context model list corresponding to a sixth index.

In one example shown in Table 3, the first preset threshold is larger than or equal to 1, the attribute residual of the first channel is C1, the attribute residual of the second channel is C3, and the attribute residual of the third channel is C2. When the attribute residual C1 of the first channel of the current point cloud point obtained by decoding the bitstream data of the attribute residual C1 of the first channel is not equal to 1 and the attribute residual C2 of the third channel is not equal to 1, the selected first context model for decoding the bitstream data of the first flag bit "isOne" of the attribute residual C3 of the second channel is the first context model corresponding to the sixth index (that is, the index 6) in the context model list.

In some embodiments, the first index, the second index, the third index, the fourth index, the fifth index, and the sixth index may be different indexes.

Through this implementation manner, the context model of the bitstream data of the first flag bit may be optimized without adding additional complexity, which may help to improve the efficiency of decoding the bitstream data of the first flag bit subsequently.

At S403, a second context model for decoding the bitstream data of the second flag bit is selected from the context model list according to a second condition, and the bitstream data of the second flag bit is decoded to obtain the binary code indicating the second flag bit.

In one embodiment, the data decoding device may select the second context model for decoding the bitstream data of the second flag bit from the context model list according to a second condition, to decode the bitstream data of the second flag bit and obtain the binary code indicating the second flag bit. In some embodiments, when the first context model and the second context model corresponding to a same index in the context model list, the first condition and the second condition may be different from each other.

In one embodiment, the bitstream data of the current point cloud point may include the bitstream data of the second flag bit, or the bitstream data of the current point cloud point may include the bitstream data of the second flag bit and the bitstream data of the first flag bit.

In one embodiment, when the bitstream data of the current point cloud point includes the bitstream data of the second flag bit and the bitstream data of the first flag bit, the second context model for decoding the bitstream data of the second flag bit may be selected from the context model list according to the second condition first, to decode the bitstream data of the second flag bit and obtain the binary code indicating the second flag bit. And then the first context model for decoding the bitstream data of the first flag bit may be selected from the context model list according to the first condition, to decode the bitstream data of the first flag bit and obtain the binary code indicating the first flag bit.

In some embodiments, the first context model and the second context model may respectively be context models for decoding the bitstream data of different flag bits of the attribute residual of a same channel. In some embodiments, the first context model and the second context model may be context models corresponding to the same index in the context model list. In some other embodiments, the first context model and the second context model may be context models corresponding to different indexes in the context model list. In some embodiments, the index may include but is not limited to characters such as numbers and letters.

In an example, the first context model may be the context model corresponding to index 0 in the context model list for decoding the bitstream data of the first flag bit "isOne" of the attribute residual of the first channel, and the second context model may be a context model corresponding to index 0 in the context model list for decoding the bitstream data of the second flag bit "isZero" of the attribute residual of the first channel.

In another example, the first context model may be the context model corresponding to index 0 in the context model list for decoding the bitstream data of the first flag bit "isOne" of the attribute residual of the second channel, and the second context model may be a context model corresponding to index 0 in the context model list for decoding the bitstream data of the second flag bit "isZero" of the attribute residual of the second channel.

In one embodiment, when the data decoding device selects the second context model for decoding the bitstream data of the second flag bit from the context model list according to the second condition, it may, based on whether the attribute residual of the first channel of the current point cloud point is equal to the second preset threshold, select from the context model list the second context model used to decode the bitstream data of the second flag bit of the attribute residual of the second channel. In some embodiments, the second preset threshold may be zero. In some embodiments, the second preset threshold may be the same as the first preset threshold, or the second preset threshold may be different from the first preset threshold.

In one embodiment, when the attribute residual of the first channel of the current point cloud point is equal to the second preset threshold, the data decoding device may select a context model corresponding to the second index as the second context model for decoding the bitstream data of the second flag bit of the attribute residual of the second channels, from the context model list. When the attribute residual of the first channel of the current point cloud point is not equal to the second preset threshold, the data decoding device may select a context model corresponding to the first index as the second context model for decoding the bitstream data of the second flag bit of the attribute residual of the second channels, from the context model list.

In one embodiment shown in Table 2, the second preset threshold is different from the first preset threshold, the attribute residual of the first channel is C1, and the attribute residual of the second channel is C2, and the second preset threshold value is 0. When the attribute residual C1 of the first channel of the current point cloud point is equal to 0, the data decoding device may select the context model corresponding to the index 1 as the second context model for decoding the bitstream data of the second flag bit "isZero" of the attribute residual C2 of the second channel, from the context model list. When the attribute residual C1 of the first channel of the current point cloud point is not equal to 0, the data decoding device may select the context model corresponding to the index 2 as the second context model for decoding the bitstream data of the second flag bit "isZero" of the attribute residual C2 of the second channel, from the context model list.

In one embodiment, when the data decoding device selects the second context model for decoding the bitstream data of the second flag bit from the context model list according to the second condition, it may determine whether the attribute residual of the first channel of the current point cloud point is larger than the second preset threshold and whether the attribute residual of the third channel of the current point cloud point is larger than the second preset threshold, and then select from the context model list the second context model used to decode the bitstream data of the second flag bit of the attribute residual of the second channel according to the determination result. In some embodiments, the second preset threshold may be different from the first preset threshold.

In one embodiment, when the attribute residual of the first channel of the current point cloud point is smaller than or equal to the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the third index in the context model list.

In one embodiment shown in Table 4, the second preset threshold is same as the first preset threshold, the second preset threshold value is larger than or equal to 1, the attribute residual of the first channel is C1, the attribute residual of the second channel is C3, and the attribute residual of the third channel is C2. When the attribute residual C1 of the first channel of the current point cloud point is smaller than or equal to 1 and the attribute residual C2 of the third channel of the current point cloud point is smaller than or equal to 1, the second context model selected for decoding the bitstream data of the second flag bit "isZero" of the attribute residual C3 of the second channel, may be the context model corresponding to the third index (that is, the index 3) from the context model list.

In one embodiment, when the attribute residual of the first channel of the current point cloud point is smaller than or equal to the second preset threshold and the attribute residual of the third channel of the current point cloud point is larger than the second preset threshold, the second context model selected for decoding the bitstream data of the second flag bit of the attribute residual of the second channels may be the context model corresponding to the fourth index in the context model list.

In one embodiment shown in Table 4, the second preset threshold is same as the first preset threshold, the second preset threshold value is larger than or equal to 1, the attribute residual of the first channel is C1, the attribute residual of the second channel is C3, and the attribute residual of the third channel is C2. When the attribute residual C1 of the first channel of the current point cloud point is smaller than or equal to 1 and the attribute residual C2 of the third channel of the current point cloud point is larger than 1, the second context model selected for decoding the bitstream data of the second flag bit "isZero" of the attribute residual C3 of the second channel, may be the context model corresponding to the fourth index (that is, the index 4) from the context model list.

In one embodiment, when the attribute residual of the first channel of the current point cloud point is larger than the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the fifth index in the context model list.

In one embodiment shown in Table 4, the second preset threshold is same as the first preset threshold, the second preset threshold value is larger than or equal to 1, the attribute residual of the first channel is C1, the attribute residual of the second channel is C3, and the attribute residual of the third channel is C2. When the attribute residual C1 of the first channel of the current point cloud point is larger than 1 and the attribute residual C2 of the third channel of the current point cloud point is smaller than or equal to 1, the second context model selected for decoding the bitstream data of the second flag bit "isZero" of the attribute residual C3 of the second channel, may be the context model corresponding to the fifth index (that is, the index 5) from the context model list.

In one embodiment, when the attribute residual of the first channel of the current point cloud point is larger than the second preset threshold and the attribute residual of the third channel of the current point cloud point is larger than the second preset threshold, the second context model selected for decoding the bitstream data of the second flag bit of the attribute residual of the second channels may be the context model corresponding to the sixth index in the context model list.

In one embodiment shown in Table 4, the second preset threshold is same as the first preset threshold, the second preset threshold value is larger than or equal to 1, the attribute residual of the first channel is C1, the attribute residual of the second channel is C3, and the attribute residual of the third channel is C2. When the attribute residual C1 of the first channel of the current point cloud point is larger than 1 and the attribute residual C2 of the third channel of the current point cloud point is larger than 1, the second context model selected for decoding the bitstream data of the second flag bit "isZero" of the attribute residual C3 of the second channel, may be the context model corresponding to the sixth index (that is, the index 6) from the context model list.

Through this implementation manner, the context model of the bitstream data of the second flag bit may be optimized without adding additional complexity, which may help to improve the efficiency of decoding the bitstream data of the second flag bit subsequently.

At S404, inverse binarization is performed on the binary code indicating the first flag bit and the binary code indicating the second flag bit, to obtain the attribute residual of the current point cloud point.

In one embodiment, the data decoding device may perform the inverse binarization on the binary code indicating the first flag bit and the binary code indicating the second flag bit, to obtain the attribute residual of the current point cloud point.

In one embodiment, when the data decoding device performs the inverse binarization on the binary code indicating the first flag bit and the binary code indicating the second flag bit, it may perform the inverse binarization on the binary code indicating the first flag bit and the binary code indicating the second flag bit to obtain encoded values, and then it may decode the encoded values according to a preset decoding method, to obtain the attribute residual of the current point cloud point.

In one example shown in FIG. 1, the data decoding device performs inverse binarization on the binary code indicating the first flag bit "isOne" and the binary code indicating the second flag bit "isZero," and obtains the encoded values 0, 73, 0, 50, 0, 32, 0, 15, 1, 12, N, and then decode the encoded values according to the decoding method corresponding to the zero run length encoding method. 0 in the encoded values is deleted, 1 in the encoded values is decoded to 0, and N in the encoded values is decoded to N consecutive 0s, such that the attribute residual of the current point cloud point is 73, 50, 32, 15, 0, 12, 0, 0, 0, . . . , 0, including N consecutive 0s.

In the present disclosure, the data decoding device may obtain the stream data of the first flag bit and the bit stream data of the second flag bit of the current point cloud point, and select the first context model for decoding the bitstream data of the first flag bit from the context model list according to the first condition, to obtain the binary code for indicating the first flag bit; and select the second context model for decoding the bitstream data of the second flag bit from the context model list according to the second condition, to obtain the binary code for indicating the second flag bit. Then the binary code for indicating the first flag bit and the binary code for indicating the second flag bit may be inversely binarized to obtain the attribute residual of the current point cloud point. Through this implementation, the decoding efficiency may be improved without adding additional complexity.

Figure 5:
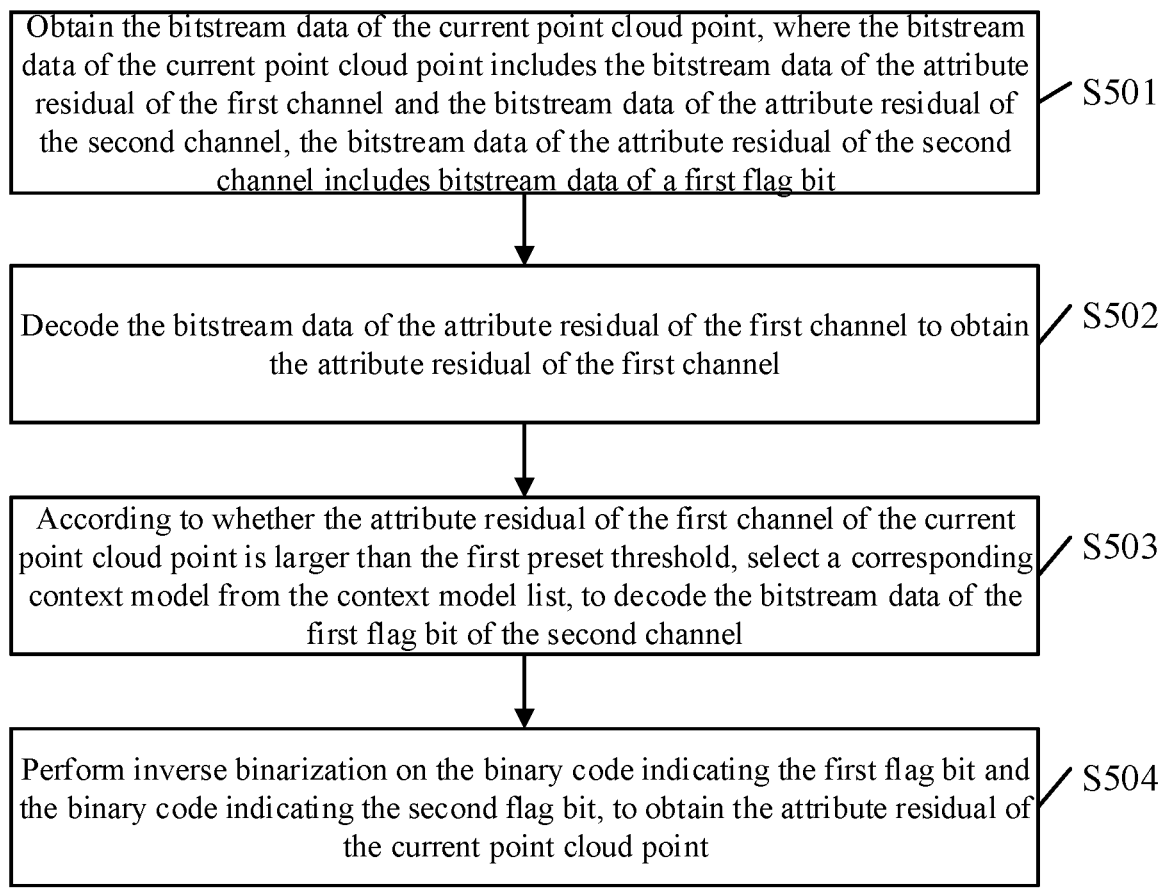
FIG. 5 is a schematic flow chart of another data decoding method consistent with the present disclosure.

The present disclosure also provides another data decoding method. In one embodiment shown in FIG. 5, the data decoding method may be applied to a data encoding device. The data decoding device may be set at a smart terminal (such as a cell phone, a tablet, etc.). As shown in FIG. 4, the method includes S501 to S504.

At S501, the bitstream data of the current point cloud point is obtained. The bitstream data of the current point cloud point may include the bitstream data of the attribute residual of the first channel and the bitstream data of the attribute residual of the second channel. The bitstream data of the attribute residual of the second channel may include bitstream data of a first flag bit.

In some embodiments, the data decoding device may obtain the bitstream data of the current point cloud point. The bitstream data of the current point cloud point may include the bitstream data of the attribute residual of the first channel and the bitstream data of the attribute residual of the second channel. The bitstream data of the attribute residual of the second channel may include bitstream data of a first flag bit. The first flag bit may be used to indicate whether the attribute residual of the second channel of the current point cloud point is N where N is larger than or equal to 0.

At S502, the bitstream data of the attribute residual of the first channel is decoded to obtain the attribute residual of the first channel.

In one embodiment, the data decoding device may decode the bitstream data of the attribute residual of the first channel to obtain the attribute residual of the first channel. In some embodiments, the attribute residual of the first channel may be larger than or equal to 0. In one embodiment shown in FIG. 2, the data decoding device may decode the bitstream data of the attribute residual C1 of the first channel to obtain the attribute residual C1 of the first channel.

At S503, according to whether the attribute residual of the first channel of the current point cloud point is larger than the first preset threshold, a corresponding context model is selected from the context model list to decode the bitstream data of the first flag bit of the second channel.

In one embodiment, the data decoding device may, according to whether the attribute residual of the first channel of the current point cloud point is larger than the first preset threshold, select the corresponding context model from the context model list to decode the bitstream data of the first flag bit of the second channel. In one embodiment, the first preset threshold may be larger than 0. In one embodiment, the first preset threshold may be larger than or equal to 1.

In one embodiment, when the data decoding device selects the context model for decoding the bitstream data of the first flag bit of the second channel from the context model list according to whether the attribute residual of the first channel of the current point cloud point is larger than the first preset threshold, it may determine whether the attribute residual of the first channel is larger than a first preset threshold. When the attribute residual of the first channel of the current point cloud point is not larger than the first preset threshold, the context model corresponding to the first index in the context model list may be selected to decode the bitstream data of the first flag bit of the attribute residual of the second channel. When the attribute residual of the first channel of the current point cloud point is larger than the first preset threshold, the context model corresponding to the second index in the context model list may be selected to decode the bitstream data of the first flag bit of the attribute residual of the second channel.

In an embodiment, the bitstream data corresponding to the second channel may further include the bitstream data of the second flag bit. The data decoding device may select the context model for decoding the bitstream data of the first flag bit of the second channel from the context model list according to whether the attribute residual of the first channel of the current point cloud point is equal to the second preset threshold. In some embodiments, the second preset threshold and the first preset threshold may be the same or different, which is not specifically limited in the present disclosure.

In one embodiment, when the data decoding device selects the context model for decoding the bitstream data of the first flag bit of the attribute residual of the second channel from the context model list according to whether the attribute residual of the first channel of the current point cloud point is larger than the first preset threshold, it may determine whether the attribute residual of the first channel of the current point cloud point is larger than the first preset threshold and whether the attribute residual of the third channel is larger than the first preset threshold. Then the context model for decoding the bitstream data of the first flag bit of the second channel may be selected from the context model list according to the determination result.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In some embodiments, the second flag bit of the binary code of the attribute residual of the first channel may be used to indicate whether the attribute residual of the first channel is 1, or the first flag bit of the binary code of the attribute residual of the first channel may be used to indicate whether the attribute residual of the first channel is 2.

In some embodiments, the second flag bit of the binary code of the attribute residual of the first channel may be used to indicate whether the attribute residual of the first channel is 0, or the first flag bit of the binary code of the attribute residual of the first channel may be used to indicate whether the attribute residual of the first channel is 1.

In one embodiment, when the attribute residual of the first channel of the current point cloud point is smaller than or equal to the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a third index.

In one embodiment, when the attribute residual of the first channel of the current point cloud point is smaller than or equal to the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a fourth index.

In one embodiment, when the attribute residual of the first channel of the current point cloud point is larger the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a fifth index.

In one embodiment, when the attribute residual of the first channel of the current point cloud point is larger the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a sixth index.

In one embodiment, based on whether the attribute residual of the first channel of the current point cloud point is larger than the second preset threshold and whether the attribute residual of the third channel is larger than the second preset threshold, the data decoding device may select from the context model list the context model used to decode the bitstream data of the second flag bit of the attribute residual of the second channel.

In one embodiment, when the attribute residual of the first channel of the current point cloud point is smaller than or equal to the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the third index in the context model list.

In one embodiment, when the attribute residual of the first channel of the current point cloud point is smaller than or equal to the second preset threshold and the attribute residual of the third channel of the current point cloud point is larger than the second preset threshold, the second context model selected for decoding the bitstream data of the second flag bit of the attribute residual of the second channels may be the context model corresponding to the fourth index in the context model list.

In one embodiment, when the attribute residual of the first channel of the current point cloud point is larger than the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the fifth index in the context model list.

In one embodiment, when the attribute residual of the first channel of the current point cloud point is larger than the second preset threshold and the attribute residual of the third channel of the current point cloud point is larger than the second preset threshold, the second context model selected for decoding the bitstream data of the second flag bit of the attribute residual of the second channels may be the context model corresponding to the sixth index in the context model list.

In the present disclosure, the data decoding device may obtain the bitstream data of the current point cloud point. The bitstream data of the current point cloud point may include the bitstream data of the attribute residual of the first channel and the bitstream data of the attribute residual of the second channel. The bitstream data of the attribute residual of the second channel may include bitstream data of a first flag bit. The bitstream data of the attribute residual of the first channel may be decoded to obtain the attribute residual of the first channel. The data decoding device may select the corresponding context model for decoding the bitstream data of the first flag bit of the second channel from the context model list, according whether the attribute residual of the first channel is larger than the first preset threshold. Through this implementation, the decoding efficiency may be improved without adding additional complexity.

At S504, inverse binarization is performed on the binary code indicating the first flag bit and the binary code indicating the second flag bit, to obtain the attribute residual of the current point cloud point.

Figure 6:
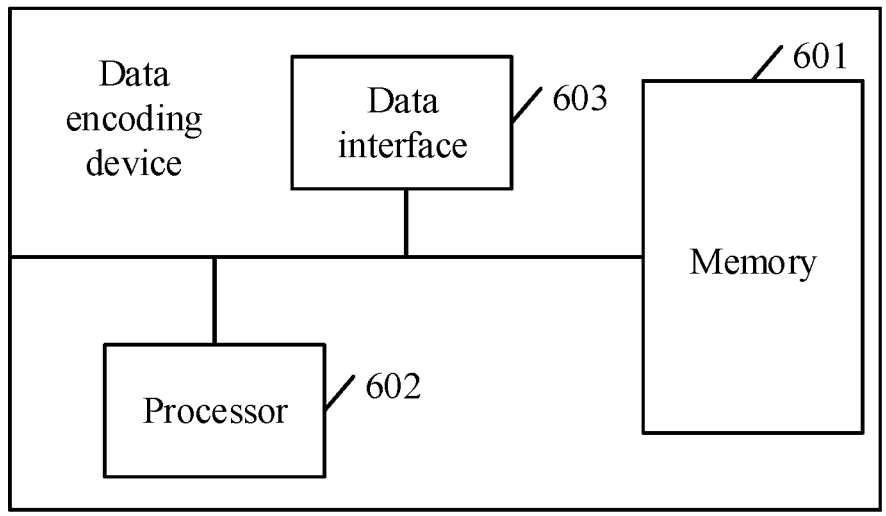
FIG. 6 is a schematic block diagram of a data encoding device consistent with the present disclosure.

The present disclosure also provides a data encoding device. In one embodiment shown in FIG. 6, the data encoding device includes a memory 601, a processor 602, and a data interface 603.

The memory 601 may include a volatile memory. The memory 601 may also include a non-volatile memory. The memory 601 may also include a combination of a volatile memory or a non-volatile memory. The processor 602 may be a central processing unit (CPU). The processor 602 may further include a hardware data encoding device. The hardware data encoding device may be an application-specific integrated circuit (ASIC), a programmable logic device (PLD), or a combination thereof. For example, it may be a complex programmable logic device (CPLD), a field-programmable gate array (FPGA), or any combination thereof.

The memory 601 may be configured to store programs. When the programs are executed, the processor 602 may be configured to call the programs stored in the memory 601 to:
  obtain attribute residual of a current point cloud point;
  binarize the attribute residual to obtain a binary code of the current point cloud point, where the binary code of the current point cloud point includes a binary code for indicating a first flag bit and a binary code for indicating a second flag bit;
  select a first context model from a context model list according to a first condition, for encoding the binary code of the first flag bit;
  select a second context model from the context model list according to a second condition, for encoding the binary code of the second flag bit, where the first condition and the second condition are different from each other when the first context model and the second context model correspond to the same index in the context model list;
  use the first context model to encode the binary code of the first flag bit; and
  use the second context model to encode the binary code of the second flag bit.

In some embodiments, the binary code of the current point cloud point may include the binary code of the attribute residual of a first channel, the binary code of the attribute residual of a second channel, and the binary code of the attribute residual of a third channel.

In some embodiments, the first context model and the second context model may respectively be context models used to encode different flags of the attribute residual of the same channel.

In some embodiments, the first flag bit may be used to indicate whether the attribute residual of one channel of the current point cloud point is N+1, and the second flag bit may be used to indicate whether the attribute residual of one channel of the current point cloud point is N, where N is greater than or equal to 0.

In one embodiment, when being configured to select the first context model for encoding the binary code of the first flag bit from the context model list according to the first condition, the processor 602 may be specifically configured to:
  select the first context model for encoding the binary code of the first flag bit of the attribute residual of the second channel from the context model list according to whether the attribute residual of the first channel of the current point cloud point is larger than a first preset threshold. The first preset threshold may be larger than 0.

In one embodiment, when the attribute residual of the first channel of the current point cloud point is larger than the first preset threshold, the selected first context model for encoding the binary code of the first flag bit of the attribute residual of the second channel may be a context model in the context model list corresponding to a first index. When the attribute residual of the first channel of the current point cloud point is not larger than the first preset threshold, the selected first context model for encoding the binary code of the first flag bit of the attribute residual of the second channel may be a context model in the context model list corresponding to a second index.

In one embodiment, when being configured to select the second context model for encoding the binary code of the second flag bit from the context model list according to the second condition, the processor 602 may be specifically configured to:
  select the second context model for encoding the binary code of the second flag bit of the attribute residual of the second channel from the context model list according to whether the attribute residual of the first channel of the current point cloud point is equal to a second preset threshold.

In one embodiment, when being configured to select the first context model for encoding the binary code of the first flag bit of the attribute residual of the second channel from the context model list according to whether the attribute residual of the first channel of the current point cloud point is larger than a first preset threshold, the processor 602 may be specifically configured to:
  determine whether the attribute residual of the first channel of the current point cloud point is larger than the first preset threshold and whether the attribute residual of the third channel of the current point cloud point is larger than the first preset threshold; and
  select the first context model for encoding the binary code of the first flag bit of the attribute residual of the second channel from the context model list according to the determination results.

In one embodiment, when the attribute residual of the first channel of the current point cloud point is smaller than or equal to the first preset threshold and the attribute residual of the third channel of the current point cloud point is smaller than or equal to the first preset threshold, the selected first context model for encoding the binary code of the first flag bit of the attribute residual of the second channel may be a context model in the context model list corresponding to a third index.

In one embodiment, when the attribute residual of the first channel of the current point cloud point is smaller than or equal to the first preset threshold and the attribute residual of the third channel of the current point cloud point is larger than the first preset threshold, the selected first context model for encoding the binary code of the first flag bit of the attribute residual of the second channel may be a context model in the context model list corresponding to a fourth index.

In one embodiment, when the attribute residual of the first channel of the current point cloud point is larger than the first preset threshold and the attribute residual of the third channel of the current point cloud point is smaller than or equal to the first preset threshold, the selected first context model for encoding the binary code of the first flag bit of the attribute residual of the second channel may be a context model in the context model list corresponding to a fifth index.

In one embodiment, when the attribute residual of the first channel of the current point cloud point is larger than the first preset threshold and the attribute residual of the third channel of the current point cloud point is larger than the first preset threshold, the selected first context model for encoding the binary code of the first flag bit of the attribute residual of the second channel may be a context model in the context model list corresponding to a sixth index.

In one embodiment, when being configured to select the second context model for encoding the binary code of the second flag bit from the context model list according to the second condition, the processor 602 may be specifically configured to:
  determine whether the attribute residual of the first channel of the current point cloud point is larger than a second preset threshold and the attribute residual of the third channel is larger than the second preset threshold; and
  select the second context model for encoding the binary code of the second flag bit from the context model list according to the determination result.

In one embodiment, when the attribute residual of the first channel of the current point cloud point is smaller than or equal to the second preset threshold and the attribute residual of the third channel of the current point cloud point is smaller than or equal to the second preset threshold, the selected second context model for encoding the binary code of the second flag bit of the attribute residual of the second channel may be a context model in the context model list corresponding to the third index.

In one embodiment, when the attribute residual of the first channel of the current point cloud point is smaller than or equal to the second preset threshold and the attribute residual of the third channel of the current point cloud point is larger than the second preset threshold, the selected second context model for encoding the binary code of the second flag bit of the attribute residual of the second channel may be a context model in the context model list corresponding to the fourth index.

In one embodiment, when the attribute residual of the first channel of the current point cloud point is larger than the second preset threshold and the attribute residual of the third channel of the current point cloud point is smaller than or equal to the second preset threshold, the selected second context model for encoding the binary code of the second flag bit of the attribute residual of the second channel may be a context model in the context model list corresponding to the fifth index.

In one embodiment, when the attribute residual of the first channel of the current point cloud point is larger than the second preset threshold and the attribute residual of the third channel of the current point cloud point is larger than the second preset threshold, the selected second context model for encoding the binary code of the second flag bit of the attribute residual of the second channel may be a context model in the context model list corresponding to the sixth index.

In one embodiment, the first preset threshold may be larger than or equal to 1.

In one embodiment, the second preset threshold may be 0.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In an example, the first flag bit may be used to indicate whether the attribute residual of one channel of the current point cloud point is 2, and the second flag bit may be used to indicate whether the attribute residual of one channel of the current point cloud point is 1.

In some embodiments, the second flag bit of the binary code of the attribute residual of the first channel may be used to indicate whether the attribute residual of the first channel is 1, or the first flag bit of the binary code of the attribute residual of the first channel may be used to indicate whether the attribute residual of the first channel is 2.

In some embodiments, the second flag bit of the binary code of the attribute residual of the first channel may be used to indicate whether the attribute residual of the first channel is 0, or the first flag bit of the binary code of the attribute residual of the first channel may be used to indicate whether the attribute residual of the first channel is 1.

In some embodiments, when being configured to binarize the attribute residual to obtain the binary code of the current point cloud point, the processor 602 may be configured to:
  encode the attribute residual of the current point cloud point according to a preset encoding method to obtain encoded values; and
  perform binarization on the encoded values to obtain the binary code of the current point cloud point.

In the present disclosure, the data encoding device may binarize the attribute residual of the current point cloud point to obtain the binary code for indicating the first flag bit and the binary code for indicating the second flag bit. Then the first context model for encoding the binary code of the first flag bit may be selected from the context model list according to the first condition, and the first context model may be used to encode the binary code of the first flag bit. The second context model for encoding the binary code of the second flag bit may be selected from the context model list according to the second condition, and the second context model may be used to encode the binary code of the second flag bit. Through this implementation manner, the encoding efficiency may be improved without adding additional complexity.

Figure 7:
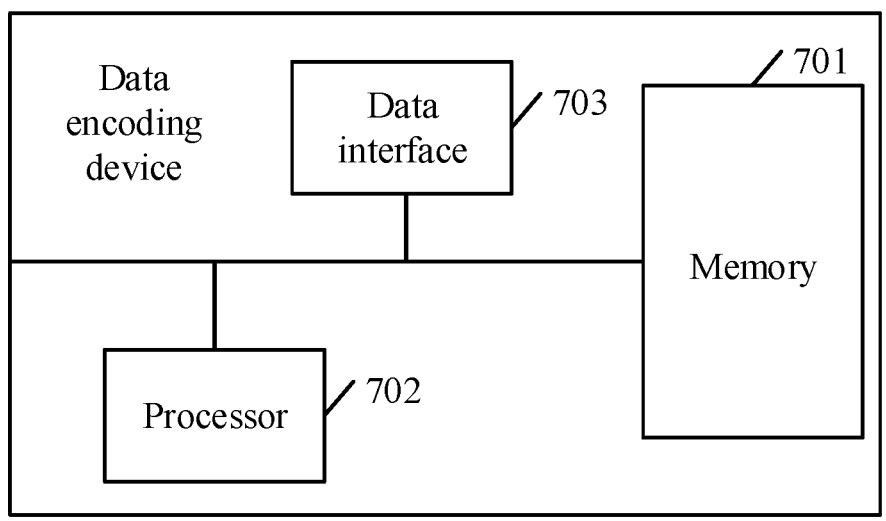
FIG. 7 is a schematic block diagram of another data encoding device consistent with the present disclosure.

The present disclosure also provides another data encoding device. In one embodiment shown in FIG. 7, the data encoding device includes a memory 701, a processor 702, and a data interface 703.

The memory 701 may include a volatile memory. The memory 601 may also include a non-volatile memory. The memory 701 may also include a combination of a volatile memory or a non-volatile memory. The processor 702 may be a central processing unit (CPU). The processor 702 may further include a hardware data encoding device. The hardware data encoding device may be an application-specific integrated circuit (ASIC), a programmable logic device (PLD), or a combination thereof. For example, it may be a complex programmable logic device (CPLD), a field-programmable gate array (FPGA), or any combination thereof.

The memory 701 may be configured to store programs. When the programs are executed, the processor 702 may be configured to call the programs stored in the memory 701 to:
  obtain attribute residual of a current point cloud point, where the attribute residual of the current point cloud point includes attribute residual of a first channel and attribute residual of a second channel;
  binarize the attribute residual of each channel to obtain a binary code corresponding to the channel, where the binary code corresponding to the second channel includes a binary code for indicating a first flag bit and the first flag bit is used to indicate whether the attribute residual of the second channel of the current point cloud point is N greater than or equal to 0; and
  select a corresponding context model from a context model list to encode the binary code of the first flag bit of the second channel, according to whether the attribute residual of the first channel of the current point cloud point is larger than a first preset threshold, where the first threshold is larger than 0.

In one embodiment, when being configured to select the context model for encoding the binary code of the first flag bit of the attribute residual of the second channel from the context model list according to whether the attribute residual of the first channel of the current point cloud point is larger than the first preset threshold, the processor 702 may be specifically configured to:
  determine whether the attribute residual of the first channel of the current point cloud point is larger than the first preset threshold;
  when it is determined that the attribute residual of the first channel of the current point cloud point is not larger than the first preset threshold, select the context model corresponding to a first index from the context model list, for encoding the binary code of the first flag bit of the attribute residual of the second channel; and
  when it is determined that the attribute residual of the first channel of the current point cloud point is larger than the first preset threshold, select the context model corresponding to a second index may be selected from the context model list, for encoding the binary code of the first flag bit of the attribute residual of the second channel.

In one embodiment, the binary code corresponding to the second channel may further include the binary code for indicating the second flag bit. The processor 702 may be further configured to select the context model for encoding the binary code of the second flag bit of the attribute residual of the second channel from the context model list according to whether the attribute residual of the first channel of the current point cloud point is equal to a second preset threshold.

In one embodiment, when being configured to select the context model for encoding the binary code of the first flag bit of the second channel from the context model list according to whether the attribute residual of the first channel of the current point cloud point is larger than a first preset threshold, the processor 702 may be specifically configured to:
  determine whether the attribute residual of the first channel of the current point cloud point is larger than the first preset threshold and whether the attribute residual of the third channel of the current point cloud point is larger than the first preset threshold; and
  select the first context model for encoding the binary code of the first flag bit of the attribute residual of the second channel from the context model list according to the determination results.

In one embodiment, when the attribute residual of the first channel of the current point cloud point is smaller than or equal to the first preset threshold and the attribute residual of the third channel of the current point cloud point is smaller than or equal to the first preset threshold, the selected first context model for encoding the binary code of the first flag bit of the attribute residual of the second channel may be a context model in the context model list corresponding to a third index.

In one embodiment, when the attribute residual of the first channel of the current point cloud point is smaller than or equal to the first preset threshold and the attribute residual of the third channel of the current point cloud point is larger than the first preset threshold, the selected first context model for encoding the binary code of the first flag bit of the attribute residual of the second channel may be a context model in the context model list corresponding to a fourth index.

In one embodiment, when the attribute residual of the first channel of the current point cloud point is larger than the first preset threshold and the attribute residual of the third channel of the current point cloud point is smaller than or equal to the first preset threshold, the selected first context model for encoding the binary code of the first flag bit of the attribute residual of the second channel may be a context model in the context model list corresponding to a fifth index.

In one embodiment, when the attribute residual of the first channel of the current point cloud point is larger than the first preset threshold and the attribute residual of the third channel of the current point cloud point is larger than the first preset threshold, the selected first context model for encoding the binary code of the first flag bit of the attribute residual of the second channel may be a context model in the context model list corresponding to a sixth index.

In one embodiment, the processor 702 may be specifically configured to:
  determine whether the attribute residual of the first channel of the current point cloud point is larger than a second preset threshold and the attribute residual of the third channel is larger than the second preset threshold; and
  select the second context model for encoding the binary code of the second flag bit of the second channel from the context model list according to the determination result.

In one embodiment, when the attribute residual of the first channel of the current point cloud point is smaller than or equal to the second preset threshold and the attribute residual of the third channel of the current point cloud point is smaller than or equal to the second preset threshold, the selected second context model for encoding the binary code of the second flag bit of the attribute residual of the second channel may be a context model in the context model list corresponding to the third index.

In one embodiment, when the attribute residual of the first channel of the current point cloud point is smaller than or equal to the second preset threshold and the attribute residual of the third channel of the current point cloud point is larger than the second preset threshold, the selected second context model for encoding the binary code of the second flag bit of the attribute residual of the second channel may be a context model in the context model list corresponding to the fourth index.

In one embodiment, when the attribute residual of the first channel of the current point cloud point is larger than the second preset threshold and the attribute residual of the third channel of the current point cloud point is smaller than or equal to the second preset threshold, the selected second context model for encoding the binary code of the second flag bit of the attribute residual of the second channel may be a context model in the context model list corresponding to the fifth index.

In one embodiment, when the attribute residual of the first channel of the current point cloud point is larger than the second preset threshold and the attribute residual of the third channel of the current point cloud point is larger than the second preset threshold, the selected second context model for encoding the binary code of the second flag bit of the attribute residual of the second channel may be a context model in the context model list corresponding to the sixth index.

In one embodiment, the first preset threshold may be larger than or equal to 1.

In one embodiment, the second preset threshold may be 0.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In an example, the first flag bit may be used to indicate whether the attribute residual of one channel of the current point cloud point is 2, and the second flag bit may be used to indicate whether the attribute residual of one channel of the current point cloud point is 1.

In some embodiments, the second flag bit of the binary code of the attribute residual of the first channel may be used to indicate whether the attribute residual of the first channel is 0, or the first flag bit of the binary code of the attribute residual of the first channel may be used to indicate whether the attribute residual of the first channel is 1.

In some embodiments, when being configured to binarize the attribute residual to obtain the binary code of the current point cloud point, the processor 702 may be configured to:
encode the attribute residual of the current point cloud point according to a preset encoding method to obtain encoded values; and
perform binarization on the encoded values to obtain the binary code of the current point cloud point.

In the present disclosure, the data encoding device may binarize the attribute residual of each channel of the current point cloud point to obtain the binary code corresponding to the channel. The binary code corresponding to the second channel may include the binary code indicating the first flag bit. According to whether the attribute residual of the first channel of the current point cloud point is larger than the first preset threshold, the corresponding context model may be selected from the context model list, to encode the binary code of the first flag bit of the second channel. Through this implementation manner, the encoding efficiency may be improved without adding additional complexity.

Figure 8:
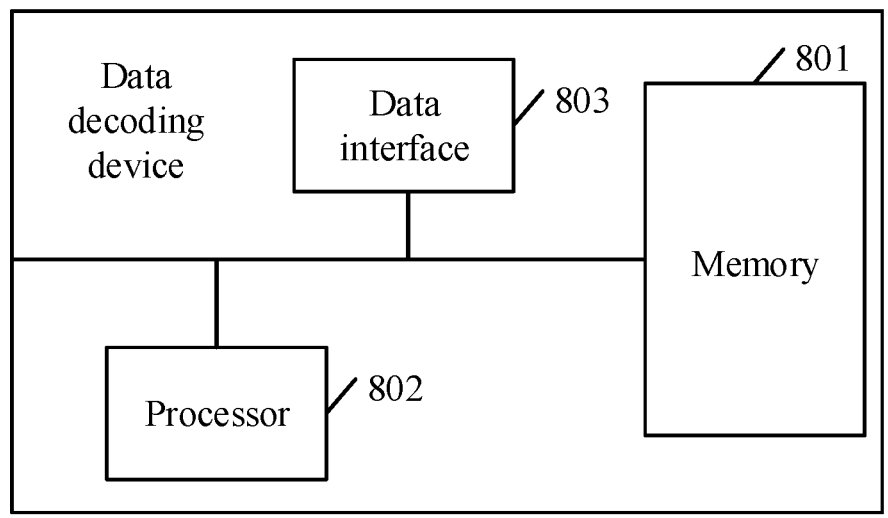
FIG. 8 is a schematic block diagram of a data decoding device consistent with the present disclosure.

The present disclosure also provides another data decoding device. In one embodiment shown in FIG. 8, the data decoding device includes a memory 801, a processor 802, and a data interface 803.

The memory 801 may include a volatile memory. The memory 601 may also include a non-volatile memory. The memory 801 may also include a combination of a volatile memory or a non-volatile memory. The processor 802 may be a central processing unit (CPU). The processor 802 may further include a hardware data encoding device. The hardware data encoding device may be an application-specific integrated circuit (ASIC), a programmable logic device (PLD), or a combination thereof. For example, it may be a complex programmable logic device (CPLD), a field-programmable gate array (FPGA), or any combination thereof.

The memory 801 may be configured to store programs. When the programs are executed, the processor 802 may be configured to call the programs stored in the memory 801 to:
obtain bitstream data of a current point cloud point, where the bitstream data includes bitstream data of a first flag bit and bitstream data of a second flag bit;
select a first context model for decoding the bitstream data of the first flag bit from a context model list according to a first condition, and decode the bitstream data of the first flag bit to obtain a binary code for indicating the first flag bit;
select a second context model for decoding the bitstream data of the second flag bit from a context model list according to a second condition, and decode the bitstream data of the second flag bit to obtain a binary code for indicating the second flag bit;
perform inverse binarization on the binary code indicating the first flag bit and the binary code indicating the second flag bit, to obtain the attribute residual of the current point cloud point.

In some embodiments, the bitstream data may include bitstream data of attribute residual of a first channel, bitstream data of attribute residual of a second channel, or bitstream data of attribute residual of a third channel.

In one embodiment, the first context model and the second context model may be respectively context models for decoding bitstream data of different flag bits of the attribute residual of the same channel.

In some embodiments, the first flag bit may be used to indicate whether the attribute residual of one channel of the current point cloud point is N+1, and the second flag bit may be used to indicate whether the attribute residual of one channel of the current point cloud point is N, where N is greater than or equal to 0.

In some embodiments, when being configured to select the first context model for decoding the bitstream data of the first flag bit from the context model list according to the first condition, the processor 802 may be specifically configured to:
decode the bitstream data of the attribute residual of the first channel to obtain the attribute residual of the first channel, and
according to whether the attribute residual of the first channel is larger than a first preset threshold, select the first context model for decoding the bitstream data of the first flag bit from the context model list. The first preset threshold may be larger than 0.

In one embodiment, when the attribute residual of the first channel of the current point cloud point is larger than the first preset threshold, the selected first context model for decoding the bitstream data of the first flag bit of the attribute residual of the second channel may be a context model in the context model list corresponding to a first index.

In one embodiment, when the attribute residual of the first channel of the current point cloud point is not larger than the first preset threshold, the selected first context model for decoding the bitstream data of the first flag bit of the attribute residual of the second channel may be a context model in the context model list corresponding to a second index.

In some embodiments, when being configured to select the second context model for decoding the bitstream data of the second flag bit from the context model list according to the second condition, the processor 802 may be specifically configured to:
  based on whether the attribute residual of the first channel of the current point cloud point is equal to the second preset threshold, select from the context model list the second context model used to decode the bitstream data of the second flag bit of the attribute residual of the second channel.

In one embodiment, when being configured to select the first context model for decoding the bitstream data of the first flag bit of the attribute residual of the second channel from the context model list according to whether the attribute residual of the first channel of the current point cloud point is larger than the first preset threshold, the processor 802 may be specifically configured to:
  determine whether the attribute residual of the first channel of the current point cloud point is larger than the first preset threshold and whether the attribute residual of the third channel is larger than the first preset threshold; and
  select the first context model for decoding the bitstream data of the first flag bit of the second channel may be selected from the context model list according to the determination result.

In one embodiment, when the attribute residual of the first channel of the current point cloud point is smaller than or equal to the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a third index.

In one embodiment, when the attribute residual of the first channel of the current point cloud point is smaller than or equal to the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a fourth index.

In one embodiment, when the attribute residual of the first channel of the current point cloud point is larger the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a fifth index.

In one embodiment, when the attribute residual of the first channel of the current point cloud point is larger the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a sixth index.

In one embodiment, when being configured to select the second context model for decoding the bitstream data of the second flag bit from the context model list according to the second condition, the processor 802 may be specifically configured to:
  determine whether the attribute residual of the first channel of the current point cloud point is larger than the second preset threshold and whether the attribute residual of the third channel of the current point cloud point is larger than the second preset threshold; and
  select from the context model list the second context model used to decode the bitstream data of the second flag bit of the attribute residual of the second channel according to the determination result.

In one embodiment, when the attribute residual of the first channel of the current point cloud point is smaller than or equal to the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the third index in the context model list.

In one embodiment, when the attribute residual of the first channel of the current point cloud point is smaller than or equal to the second preset threshold and the attribute residual of the third channel of the current point cloud point is larger than the second preset threshold, the second context model selected for decoding the bitstream data of the second flag bit of the attribute residual of the second channels may be the context model corresponding to the fourth index in the context model list.

In one embodiment, when the attribute residual of the first channel of the current point cloud point is larger than the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the fifth index in the context model list.

In one embodiment, when the attribute residual of the first channel of the current point cloud point is larger than the second preset threshold and the attribute residual of the third channel of the current point cloud point is larger than the second preset threshold, the second context model selected for decoding the bitstream data of the second flag bit of the attribute residual of the second channels may be the context model corresponding to the sixth index in the context model list.

In one embodiment, the first preset threshold may be larger than or equal to 1.

In one embodiment, the second preset threshold may be 0.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In some embodiments, the second flag bit of the binary code of the attribute residual of the first channel may be used to indicate whether the attribute residual of the first channel is 1, or the first flag bit of the binary code of the attribute residual of the first channel may be used to indicate whether the attribute residual of the first channel is 2.

In some embodiments, the second flag bit of the binary code of the attribute residual of the first channel may be used to indicate whether the attribute residual of the first channel is 0, or the first flag bit of the binary code of the attribute residual of the first channel may be used to indicate whether the attribute residual of the first channel is 1.

In one embodiment, when being configured to perform the inverse binarization on the binary code indicating the first flag bit and the binary code indicating the second flag bit, the processor 802 may be configured to:

perform the inverse binarization on the binary code indicating the first flag bit and the binary code indicating the second flag bit to obtain encoded values; and decode the encoded values according to a preset decoding method, to obtain the attribute residual of the current point cloud point.

In the present disclosure, the data decoding device may obtain the stream data of the first flag bit and the bitstream data of the second flag bit of the current point cloud point, and select the first context model for decoding the bitstream data of the first flag bit from the context model list according to the first condition, to obtain the binary code for indicating the first flag bit; and select the second context model for decoding the bitstream data of the second flag bit from the context model list according to the second condition, to obtain the binary code for indicating the second flag bit. Then the binary code for indicating the first flag bit and the binary code for indicating the second flag bit may be inversely binarized to obtain the attribute residual of the current point cloud point. Through this implementation, the decoding efficiency may be improved without adding additional complexity.

Figure 9:
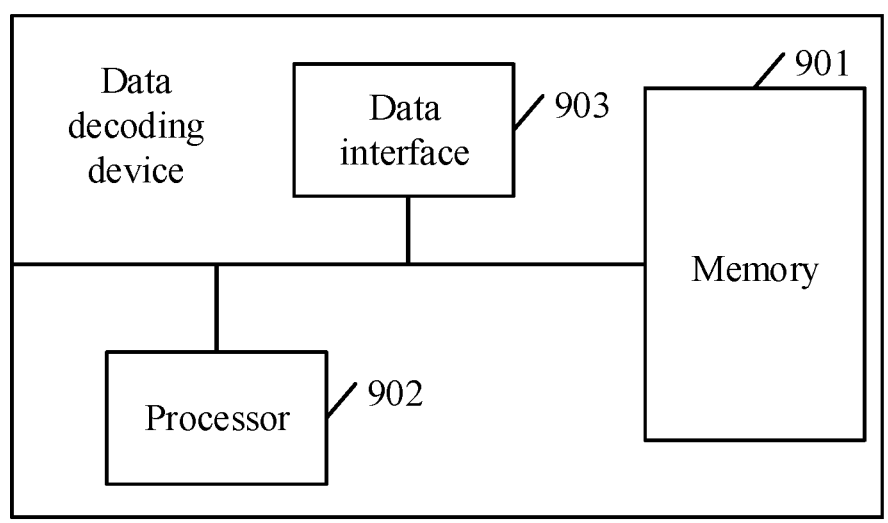
FIG. 9 is a schematic block diagram of another data decoding device consistent with the present disclosure.

The present disclosure also provides a data decoding device. In one embodiment shown in FIG. 9, the data decoding device includes a memory 901, a processor 902, and a data interface 903.

The memory 901 may include a volatile memory. The memory 901 may also include a non-volatile memory. The memory 901 may also include a combination of a volatile memory or a non-volatile memory. The processor 902 may be a central processing unit (CPU). The processor 902 may further include a hardware data encoding device. The hardware data encoding device may be an application-specific integrated circuit (ASIC), a programmable logic device (PLD), or a combination thereof. For example, it may be a complex programmable logic device (CPLD), a field-programmable gate array (FPGA), or any combination thereof.

The memory 901 may be configured to store programs. When the programs are executed, the processor 902 may be configured to call the programs stored in the memory 901 to:

obtain the bitstream data of the current point cloud point, where the bitstream data of the current point cloud point includes the bitstream data of the attribute residual of the first channel and the bitstream data of the attribute residual of the second channel, the bitstream data of the attribute residual of the second channel includes bitstream data of a first flag bit used to indicate whether the attribute residual of the second channel of the current point cloud point is N where N is larger than or equal to 0;

decode the bitstream data of the attribute residual of the first channel to obtain the attribute residual of the first channel; and according to whether the attribute residual of the first channel of the current point cloud point is larger than the first preset threshold, select a corresponding context model from the context model list, to decode the bitstream data of the first flag bit of the second channel, where the first preset threshold is larger than 0.

In one embodiment, when being configured to select the context model for decoding the bitstream data of the first flag bit of the second channel from the context model list according to whether the attribute residual of the first channel of the current point cloud point is larger than the first preset threshold, the processor 902 may be configured to:

determine whether the attribute residual of the first channel is larger than a first preset threshold;

when the attribute residual of the first channel of the current point cloud point is not larger than the first preset threshold, select the context model corresponding to the first index in the context model list to decode the bitstream data of the first flag bit of the attribute residual of the second channel; and when the attribute residual of the first channel of the current point cloud point is larger than the first preset threshold, select the context model corresponding to the second index in the context model list to decode the bitstream data of the first flag bit of the attribute residual of the second channel.

In some embodiments, the bitstream data corresponding to the second channel may further include the bitstream data of the second flag bit. The processor 902 may be further configured to select the context model for decoding the bitstream data of the first flag bit of the second channel from the context model list according to whether the attribute residual of the first channel of the current point cloud point is equal to the second preset threshold.

In one embodiment, when being configured to select the context model for decoding the bitstream data of the first flag bit of the attribute residual of the second channel from the context model list according to whether the attribute residual of the first channel of the current point cloud point is larger than the first preset threshold, the processor may be configured to:

determine whether the attribute residual of the first channel of the current point cloud point is larger than the first preset threshold and whether the attribute residual of the third channel is larger than the first preset threshold; and select the context model for decoding the bitstream data of the first flag bit of the second channel from the context model list according to the determination result.

In one embodiment, when the attribute residual of the first channel of the current point cloud point is smaller than or equal to the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a third index.

In one embodiment, when the attribute residual of the first channel of the current point cloud point is smaller than or equal to the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a fourth index.

In one embodiment, when the attribute residual of the first channel of the current point cloud point is larger the first preset threshold and the attribute residual of the third channel of the current point cloud point is smaller than or equal to the first preset threshold, the selected first context model for decoding the bitstream data of the first flag bit of the attribute residual of the second channel may be a context model in the context model list corresponding to a fifth index.

In one embodiment, when the attribute residual of the first channel of the current point cloud point is larger the first preset threshold and the attribute residual of the third channel of the current point cloud point is larger than the first preset threshold, the selected first context model for decoding the bitstream data of the first flag bit of the attribute residual of the second channel may be a context model in the context model list corresponding to a sixth index.

In one embodiment, the processor 902 may be configured to: determine whether the attribute residual of the first channel of the current point cloud point is larger than the second preset threshold and whether the attribute residual of the third channel is larger than the second preset threshold, and select from the context model list the context model used to decode the bitstream data of the second flag bit of the attribute residual of the second channel.

In one embodiment, when the attribute residual of the first channel of the current point cloud point is smaller than or equal to the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the third index in the context model list.

In one embodiment, when the attribute residual of the first channel of the current point cloud point is smaller than or equal to the second preset threshold and the attribute residual of the third channel of the current point cloud point is larger than the second preset threshold, the second context model selected for decoding the bitstream data of the second flag bit of the attribute residual of the second channels may be the context model corresponding to the fourth index in the context model list.

In one embodiment, when the attribute residual of the first channel of the current point cloud point is larger than the second preset threshold and the attribute residual of the third channel of the current point cloud point is smaller than or equal to the second preset threshold, the second context model selected for decoding the bitstream data of the second flag bit of the attribute residual of the second channels may be the context model corresponding to the fifth index in the context model list.

In one embodiment, when the attribute residual of the first channel of the current point cloud point is larger than the second preset threshold and the attribute residual of the third channel of the current point cloud point is larger than the second preset threshold, the second context model selected for decoding the bitstream data of the second flag bit of the attribute residual of the second channels may be the context model corresponding to the sixth index in the context model list.

In one embodiment, the first preset threshold may be larger than or equal to 1.

In one embodiment, the second preset threshold may be 0.

In some embodiments, the first channel may include an R channel or a Y channel, the second channel may include a G channel or a U channel, and the third channel may include a B channel or a V channel.

In some embodiments, the first channel may include an R channel or a Y channel, the second channel may include a B channel or a V channel, and the third channel may include a G channel or a U channel.

In some embodiments, the second flag bit of the binary code of the attribute residual of the first channel may be used to indicate whether the attribute residual of the first channel is 1, or the first flag bit of the binary code of the attribute residual of the first channel may be used to indicate whether the attribute residual of the first channel is 2.

In some embodiments, the second flag bit of the binary code of the attribute residual of the first channel may be used to indicate whether the attribute residual of the first channel is 0, or the first flag bit of the binary code of the attribute residual of the first channel may be used to indicate whether the attribute residual of the first channel is 1.

In the present disclosure, the data decoding device may obtain the bitstream data of the current point cloud point. The bitstream data of the current point cloud point may include the bitstream data of the attribute residual of the first channel and the bitstream data of the attribute residual of the second channel. The bitstream data of the attribute residual of the second channel may include bitstream data of a first flag bit. The bitstream data of the attribute residual of the first channel may be decoded to obtain the attribute residual of the first channel. The data decoding device may select the corresponding context model for decoding the bitstream data of the first flag bit of the second channel from the context model list, according whether the attribute residual of the first channel is larger than the first preset threshold. Through this implementation, the decoding efficiency may be improved without adding additional complexity.

The present disclosure also provides a computer-readable storage medium. The computer-readable storage medium may be configured to store a computer program. When the computer program is executed by a processor, the data encoding method provided by various embodiments of the present disclosure shown in FIG. 2 or FIG. 3, or the data decoding method provided by various embodiments of the present disclosure shown in FIG. 4 or FIG. 5, or the data encoding device provided by various embodiments of the present disclosure shown in FIG. 6 or FIG. 7, or the data decoding device provided by various embodiments of the present disclosure shown in FIG. 8 or FIG. 9 may be implemented, which will not be repeated here.

The computer-readable storage medium may be an internal storage unit of the device described in any of the foregoing embodiments of the present disclosure, such as a hard disk or a memory of the device. The computer-readable storage medium may also be an external storage device of the device, such as a plug-in hard disk equipped on the device, a smart media card (SMC), a secure digital card (SD), or a flash card, etc. Further, the computer-readable storage medium may also include both an internal storage unit of the device and an external storage device. The computer-readable storage medium may be used to store the computer program and other programs and data required by the device. The computer-readable storage medium may also be used to temporarily store data that has been output or will be output.

A person of ordinary skill in the art can be aware that the units and algorithm steps described in the embodiments disclosed herein can be implemented by electronic hardware, computer software, or a combination of both. To clearly illustrate the hardware and software interchangeability, in the above description, the composition and steps of each example have been generally described in accordance with the function. Whether these functions are executed by hardware or software depends on the specific application and design constraint conditions of the technical solution. Professionals and technicians can use different methods for each specific application to implement the described functions, but such implementation should not be considered beyond the scope of the present disclosure Those skilled in the art can clearly understand that, for the convenience and conciseness of description, the specific working processes of the above-described system, device, and unit is not repeated, and reference can be made to the corresponding processes described in the foregoing method embodiments.

In the embodiments provided in the present disclosure, it should be understood that the disclosed system, device, and method may be implemented in other ways. For example, the device embodiments described above are only illustrative. For example, the division of the units is only a logical function division, and there may be other divisions in actual implementation. For example, multiple units or components may be combined or can be integrated into another system, or some features can be ignored or not implemented. In addition, the displayed or discussed mutual coupling or direct coupling or communication connection may be indirect coupling or communication connection through some interfaces, devices or units, and may also be electrical, mechanical or other forms of connection.

The units described as separate components may or may not be physically separated, and the components displayed as units may or may not be physical units, that is, they may be located in one place, or they may be distributed on multiple network units. Some or all of the units may be selected according to actual needs to achieve the objectives of the solutions of the embodiments of the present disclosure.

In addition, the functional units in the various embodiments of the present disclosure may be integrated into one processing unit, or each unit may exist alone physically, or two or more units may be integrated into one unit. The above-mentioned integrated unit can be implemented in the form of hardware or software functional unit.

When the integrated unit is implemented in the form of a software functional unit and sold or used as an independent product, it can be stored in a computer readable storage medium. Based on this understanding, all or part of the technical solution can be embodied in the form of a software product. The computer software product is stored in a storage medium, and includes several instructions to enable a computer device (which may be a personal computer, a server, or a network device, etc.) to perform all or part of the steps of the method described in each embodiment of the present disclosure. The aforementioned storage medium includes: a U disk, a mobile hard disk, a read-only memory (ROM), a random access memory (RAM), a magnetic disk, an optical disk, or another medium that can store program codes.

The above are only specific implementations of embodiments of the present disclosure, but the scope of the present disclosure is not limited to this. Anyone familiar with the technical field can easily think of various equivalents within the technical scope disclosed in the present disclosure. These modifications or replacements shall be covered within the scope of the present disclosure. Therefore, the protection scope of the present disclosure shall be subject to the protection scope of the claims.

What is claimed is:

1. A data encoding method comprising:
   obtaining an attribute residual of a current point cloud point;
   binarizing the attribute residual to obtain a binary code of the current point cloud point, the binary code of the current point cloud point including a first binary code indicating a first flag bit and a second binary code indicating a second flag bit;
   selecting a first context model from a context model list;
   selecting a second context model from the context model list, the first context model and the second context model being different models;
   encoding the first binary code using the first context model; and
   encoding the second binary code using the second context model.

2. The method according to claim 1, wherein:
   the attribute residual of the current point cloud point includes a first attribute residual of a first channel of the current point cloud point, a second attribute residual of a second channel of the current point cloud point, and a third attribute residual of a third channel of the current point cloud point; and
   the binary code of the current point cloud point includes a binary code of the first attribute residual, a binary code of the second attribute residual, and a binary code of the third attribute residual.

3. The method according to claim 1, wherein:
   the first context model and the second context model are used to encode different flag bits of the attribute residual of a same channel of the current point cloud point.

4. The method according to claim 1, wherein:
   the first flag bit indicates whether an attribute residual of a channel of the current point cloud point is N+1, N being greater than or equal to 0; and
   the second flag bit indicates whether the attribute residual of the channel of the current point cloud point is N.

5. The method according to claim 1, wherein:
   the attribute residual of the current point cloud point includes a first attribute residual of a first channel of the current point cloud point and a second attribute residual a second channel of the current point cloud point; and
   selecting the first context model include:
   selecting the first context model for encoding the first binary code of the first flag bit of the second attribute residual from the context model list according to whether the first attribute residual is larger than a preset threshold, the preset threshold being larger than 0.

6. The method according to claim 5, wherein selecting the first context model for encoding the first binary code of the first flag bit of the second attribute residual includes:
- in response to the first attribute residual being larger than the preset threshold, selecting a context model corresponding to a first index as the first context model for encoding the first binary code of the first flag bit of the second attribute residual; and
- in response to the first attribute residual being not larger than the preset threshold, selecting a context model corresponding to a second index as the first context model for encoding the first binary code of the first flag bit of the second attribute residual.

7. The method according to claim 5, wherein:
the preset threshold is a first preset threshold; and
selecting the second context model includes:
- selecting the second context model for encoding the second binary code of the second flag bit of the second attribute residual from the context model list according to whether the first attribute residual is equal to a second preset threshold.

8. The method according to claim 5, wherein selecting the first context model for encoding the first binary code of the first flag bit of the second attribute residual includes:
- determining whether the first attribute residual and a third attribute residual of a third channel of the current point cloud point are larger than the preset threshold, to obtain a determination result; and
- selecting the first context model for encoding the first binary code of the first flag bit of the second attribute residual from the context model list according to the determination result.

9. The method according to claim 8, wherein selecting the first context model for encoding the first binary code of the first flag bit of the second attribute residual according to the determination result includes:
- in response to the first attribute residual being smaller than or equal to the preset threshold and the third attribute residual being smaller than or equal to the preset threshold, selecting a context model corresponding to a first index as the first context model for encoding the first binary code of the first flag bit of the second attribute residual;
- in response to the first attribute residual being smaller than or equal to the preset threshold and the third attribute residual being larger than the preset threshold, selecting a context model corresponding to a second index as the first context model for encoding the first binary code of the first flag bit of the second attribute residual;
- in response to the first attribute residual being larger than the preset threshold and the third attribute residual being smaller than or equal to the preset threshold, selecting a context model corresponding to a third index as the first context model for encoding the first binary code of the first flag bit of the second attribute residual; and
- in response to the first attribute residual being larger than the preset threshold and the third attribute residual being larger than the preset threshold, selecting a context model corresponding to a fourth index as the first context model for encoding the first binary code of the first flag bit of the second attribute residual.

10. A data decoding method comprising:
- obtaining bitstream data of a current point cloud point, the bitstream data including bitstream data of a first flag bit and bitstream data of a second flag bit;
- selecting a first context model from a context model list;
- decoding the bitstream data of the first flag bit using the first context model to obtain a first binary code indicating the first flag bit;
- selecting a second context model from the context model list;
- decoding the bitstream data of the second flag bit using the second context model to obtain a second binary code indicating the second flag bit; and
- performing inverse binarization on the first binary code and the second binary code to obtain an attribute residual of the current point cloud point.

11. The method according to claim 10, wherein:
- the attribute residual of the current point cloud point includes a first attribute residual of a first channel of the current point cloud point, a second attribute residual of a second channel of the current point cloud point, and a third attribute residual of a third channel of the current point cloud point; and
- the bitstream data includes bitstream data of the first attribute residual, bitstream data of the second attribute residual, and bitstream data of the third attribute residual.

12. The method according to claim 10, wherein:
the first context model and the second context model are used to decode bitstream data of different flag bits of the attribute residual of a same channel of the current point cloud point.

13. The method according to claim 10, wherein:
- the first flag bit indicates whether an attribute residual of a channel of the current point cloud point is N+1, N being greater than or equal to 0; and
- the second flag bit indicates whether the attribute residual of the channel of the current point cloud point is N.

14. The method according to claim 10, wherein:
- the attribute residual of the current point cloud point includes a first attribute residual of a first channel of the current point cloud point and a second attribute residual of a second channel of the current point cloud point;
- the bitstream data includes bitstream data of the first attribute residual and bitstream data of the second attribute residual; and
- selecting the first context model includes:
  - decoding the bitstream data of the first attribute residual to obtain the first attribute residual; and
  - selecting the first context model for decoding the bitstream data of the first flag bit of the second attribute residual from the context model list according to whether the first attribute residual is larger than a preset threshold, the preset threshold being larger than 0.

15. The method according to claim 14, wherein selecting the first context model for decoding the bitstream data of the first flag bit of the second attribute residual includes:
- in response to the first attribute residual being larger than the preset threshold, selecting a context model corresponding to a first index as the first context model for decoding the bitstream data of the first flag bit of the second attribute residual; and
- in response to the first attribute residual being not larger than the preset threshold, selecting a context model corresponding to a second index as the first context model for decoding the bitstream data of the first flag bit of the second attribute residual.

16. The method according to claim 14, wherein:
the preset threshold is a first preset threshold; and
selecting the second context model includes:
selecting the second context model decoding the bitstream data of the second flag bit of the second attribute residual from the context model list according to whether the first attribute residual is equal to a second preset threshold.

17. The method according to claim 14, wherein selecting the first context model for decoding the bitstream data of the first flag bit of the second attribute residual includes:
determining whether the first attribute residual and a third attribute residual of a third channel of the current point cloud point are larger than the preset threshold to obtain a determination result; and
selecting the first context model for decoding the bitstream data of the first flag bit of the second channel from the context model list according to the determination result.

18. The method according to claim 17, wherein selecting the first context model for decoding the bitstream data of the first flag bit of the second channel according to the determination result includes:
in response to the first attribute residual being smaller than or equal to the preset threshold and the third attribute residual being smaller than or equal to the preset threshold, selecting a context model corresponding to a first index as the first context model for decoding the bitstream data of the first flag bit of the second attribute residual;
in response to the first attribute residual being smaller than or equal to the preset threshold and the third attribute residual being smaller than or equal to the preset threshold, selecting a context model corresponding to a first index as the first context model for decoding the bitstream data of the first flag bit of the second attribute residual;
in response to the first attribute residual being larger than the preset threshold and the third attribute residual being smaller than or equal to the preset threshold, selecting a context model corresponding to a third index as the first context model for decoding the bitstream data of the first flag bit of the second attribute residual; and
in response to the first attribute residual being larger than the preset threshold and the third attribute residual being larger than the preset threshold, selecting a context model corresponding to a fourth index as the first context model for decoding the bitstream data of the first flag bit of the second attribute residual.

19. A data encoding device comprising:
a memory storing a program; and
a processor configured to execute the program to:
obtain an attribute residual of a current point cloud point;
binarize the attribute residual to obtain a binary code of the current point cloud point, the binary code of the current point cloud point including a first binary code indicating a first flag bit and a second binary code indicating a second flag bit;
select a first context model from a context model list;
select a second context model from the context model list, the first context model and the second context model being different models;
encode the first binary code using the first context model; and
encode the second binary code using the second context model.

20. The device according to claim 19, wherein:
the first flag bit indicates whether an attribute residual of a channel of the current point cloud point is N+1, N being greater than or equal to 0; and
the second flag bit indicates whether the attribute residual of the channel of the current point cloud point is N.

* * * * *